(12) United States Patent
Roblin et al.

(10) Patent No.: US 12,556,140 B2
(45) Date of Patent: Feb. 17, 2026

(54) BROADBAND SLIDING-MODE OUTPHASING POWER AMPLIFIER WITH HIGH EFFICIENCY

(71) Applicant: OHIO STATE INNOVATION FOUNDATION, Columbus, OH (US)

(72) Inventors: Patrick Roblin, Columbus, OH (US); Dominic Mikrut, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 715 days.

(21) Appl. No.: 17/823,573

(22) Filed: Aug. 31, 2022

(65) Prior Publication Data
US 2025/0219585 A1     Jul. 3, 2025

Related U.S. Application Data

(60) Provisional application No. 63/238,913, filed on Aug. 31, 2021.

(51) Int. Cl.
    *H03F 1/02*      (2006.01)
    *H03F 3/21*      (2006.01)
    *H03F 3/60*      (2006.01)

(52) U.S. Cl.
CPC ............ *H03F 1/0288* (2013.01); *H03F 3/211* (2013.01); *H03F 3/602* (2013.01); *H03F 2200/451* (2013.01)

(58) Field of Classification Search
CPC .... H03F 1/0288; H03F 2200/451; H03F 3/68; H03F 3/211; H03F 3/602; H03F 3/195

USPC .............................................. 330/124 R, 295
See application file for complete search history.

(56) References Cited

U.S. PATENT DOCUMENTS

| | | | | |
|---|---|---|---|---|
| 8,384,475 | B2 * | 2/2013 | Gustavsson | H03F 3/602 |
| | | | | 330/124 R |
| 9,866,190 | B2 * | 1/2018 | Hellberg | H03F 1/0288 |
| 10,187,014 | B2 * | 1/2019 | Hellberg | H03F 1/02 |
| 11,050,388 | B2 * | 6/2021 | Wang | H03F 3/195 |
| 11,784,610 | B2 * | 10/2023 | Lamy | H03F 1/0288 |
| | | | | 330/295 |
| 2014/0347133 | A1 * | 11/2014 | Qureshi | H03F 1/07 |
| | | | | 330/295 |

OTHER PUBLICATIONS

H. Chireix, "High power outphasing modulation," Proc. Inst. Radio Eng., vol. 23, No. 11, pp. 1370-1392, Nov. 1935.

(Continued)

*Primary Examiner* — Khanh V Nguyen
(74) *Attorney, Agent, or Firm* — Meunier Carlin & Curfman LLC

(57) ABSTRACT

A dual-input microwave power amplifier (PA) with high-efficiency. The PA exploits the continuum of modes between the Doherty and Chireix PA mode of operation to achieve 40% fractional bandwidth while relying on the physical linear dispersion of the transmission lines of the lossless output combiner. A constant output is achieved at peak power over the entire bandwidth. The output backoff varies from 6 dB in the Doherty mode to 8 dB in the Chireix mode. The PA operates over a wider range of frequencies from 1 to 8 GHz. The dual-input PA operates in mixed-mode and thus requires variable input power drives and outphasing angle.

16 Claims, 21 Drawing Sheets

(56) References Cited

OTHER PUBLICATIONS

F. Raab "Efficiency of outphasing RF power-amplifier systems," IEEE Trans. Commun., vol. COM-33, No. 10, pp. 1094-1099, Oct. 1985.
W. H. Doherty, "A new high efficiency power amplifier for modulated waves," Proc. IRE, vol. 24, pp. 1163-1182, Sep. 1936.
F. H. Raab, "Efficiency of Doherty RF power-amplifier systems," IEEE Transcation on Broadcasting, vol. BC-33, pp. 77-83, Sep. 1987.
C. Liang, P. Roblin, Y. Hahn, Z. Popovic, and H. C. Chang, "Novel Outphasing Power Amplifiers Designed With an Analytic Generalized Doherty—Chireix Continuum Theory," IEEE Trans. Circuits. Syst. I, Reg. Papers., vol. 66, No. 8, pp. 2935-2948, Apr. 2019.

\* cited by examiner (e) OBO (f) $P_{out}$

BROADBAND SLIDING-MODE OUTPHASING POWER AMPLIFIER WITH HIGH EFFICIENCY

CROSS-REFERENCE TO RELATED APPLICATION

This application claims priority to U.S. Provisional Patent Application No. 63/238,913, filed Aug. 31, 2021, entitled "BROADBAND SLIDING-MODE OUTPHASING POWER AMPLIFIER WITH HIGH EFFICIENCY," which is incorporated herein by reference in its entirety.

STATEMENT OF GOVERNMENT SUPPORT

This invention was made with government support under grant/contract number 1952907 awarded by the National Science Foundation and grant/contract number WBI-IL-2019-10-002 awarded by the U.S. Air Force Research Lab. The government has certain rights in the invention.

BACKGROUND

Modern communication systems rely on high spectral efficiency signals exhibiting large peak to average power ratios (PAPR) and this has created a need for power amplifiers to maintain a high efficiency at both peak and back-off power levels. Architectures such as the Doherty and Chireix PAs have garnered a lot of interest in an effort to achieve a high average efficiency from peak to back-off power levels. Unfortunately, both the Doherty and Chireix amplifiers tend to be narrow band in their operation. To address this shortcoming, recent investigations in the Doherty and Chireix outphasing architectures has led to reveal a continuum of operating modes referred to as the Doherty-Chireix Continuum. The Doherty-Chireix continuum is a 2D design space for dual-input outphasing PAs that extends the bandwidth of traditional Doherty and Chireix amplifiers through changing the PA's mode of operation while still performing the desired load modulation behavior to achieve a high average efficiency from peak to back-off power levels. Several proof of concept PAs have been designed and fabricated in [5,6] that illustrate the desired high average efficiency from peak to back-off power levels over large fractional bandwidths. However, these solutions have not been fabricated in an integrated form factor which limit the application space for these designed PAs.

SUMMARY

This disclosure is directed to systems and methods that provide a sliding mode power amplifier (PA) on the Chireix-Doherty continuum. More specifically, the present disclosure is directed to an MMIC using the Doherty-Chireix Continuum to achieve a high average efficiency over a large operating frequency in an integrated form factor to expand the application space for such amplifiers.

Further aspects and features of embodiments of the present disclosure will become apparent to those skilled in the art upon reviewing the following detailed description.

In accordance with an aspect of the disclosure, a dual transistor power amplifier (PA) is disclosed that includes a a main branch transmission line ($TL_1$) having a main transistor, an auxiliary branch transmission line ($TL_2$) having an auxiliary transistor, and a common load ($R_L$) to which the main branch transmission line and the auxiliary branch transmission line are connected. The dual transistor PA provides a sliding mode on the Chireix-Doherty continuum by mapping an electrical length of the main branch transmission $TL_1$ and an electrical length the auxiliary branch transmission $TL_2$ across a targeted frequency band of operation with an outphasing angle. A method of operation of the dual transistor power amplifier (PA) is also disclosed.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary and the following detailed description of illustrative embodiments are better understood when read in conjunction with the appended drawings. For the purpose of illustrating the embodiments, the drawings show example constructions of the embodiments; however, the embodiments are not limited to the specific methods and instrumentalities disclosed. The drawings are described herein.

DETAILED DESCRIPTION

Figure 1:
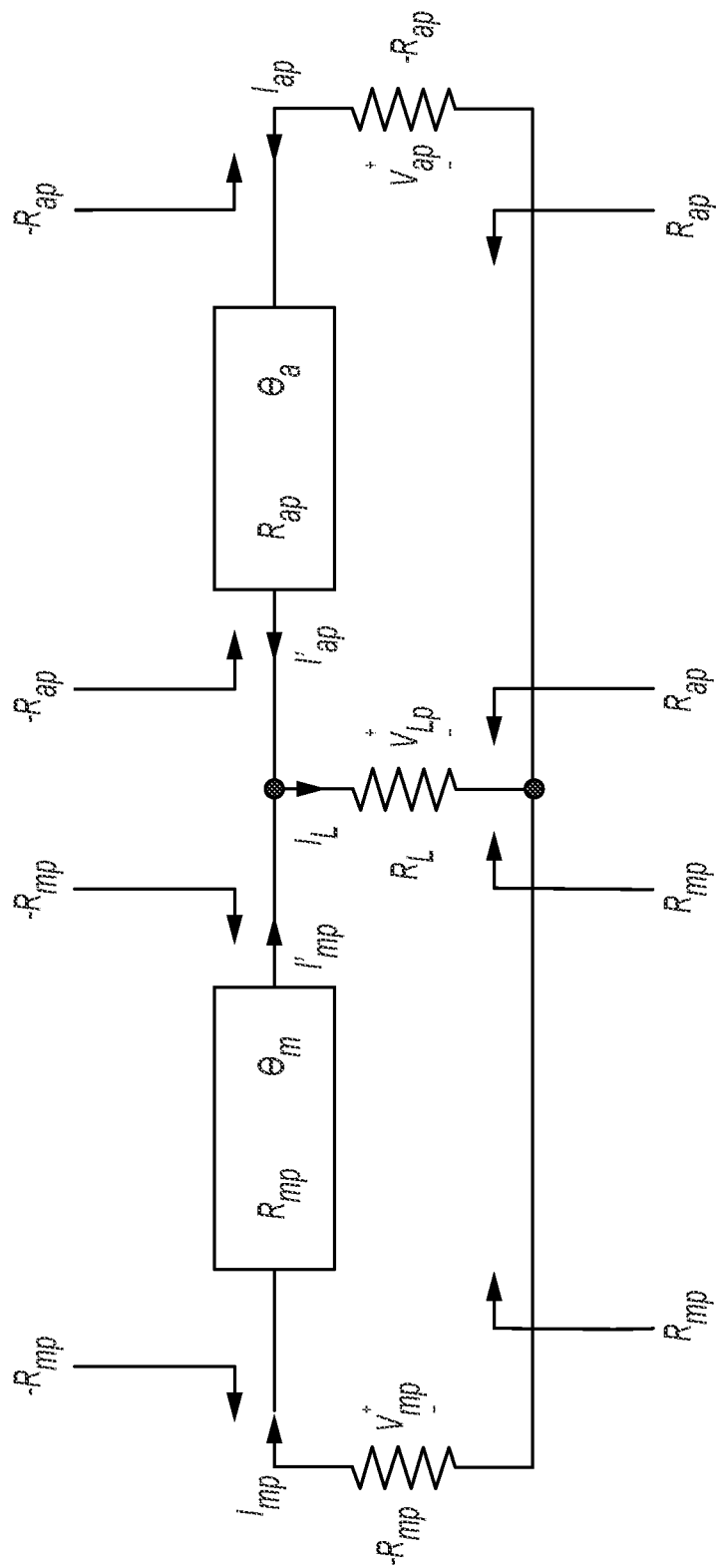
FIG. 1 illustrates an example topology of a dual-input amplifier.
Figure 2A:
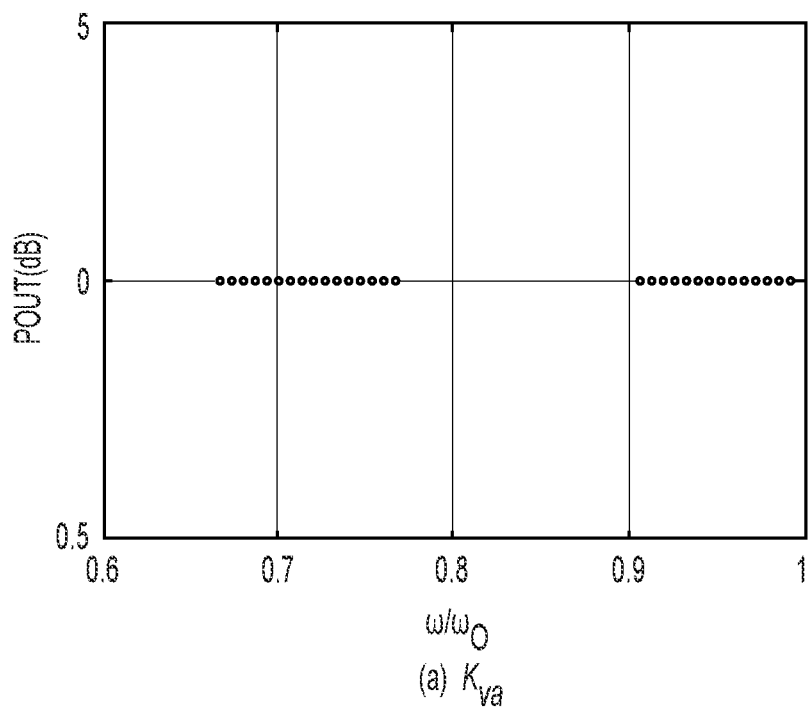
FIGS. 2A-2F illustrate a distribution of $K_{va}$, n, $K_{im}$, $\theta_b$, $\theta_m$, $\theta_a$, normalized $P_{out}$, and OBO for PA mode centered on a Chireix mode ($K_{im}$=1) at $K_{im}$.
Figure 2B:
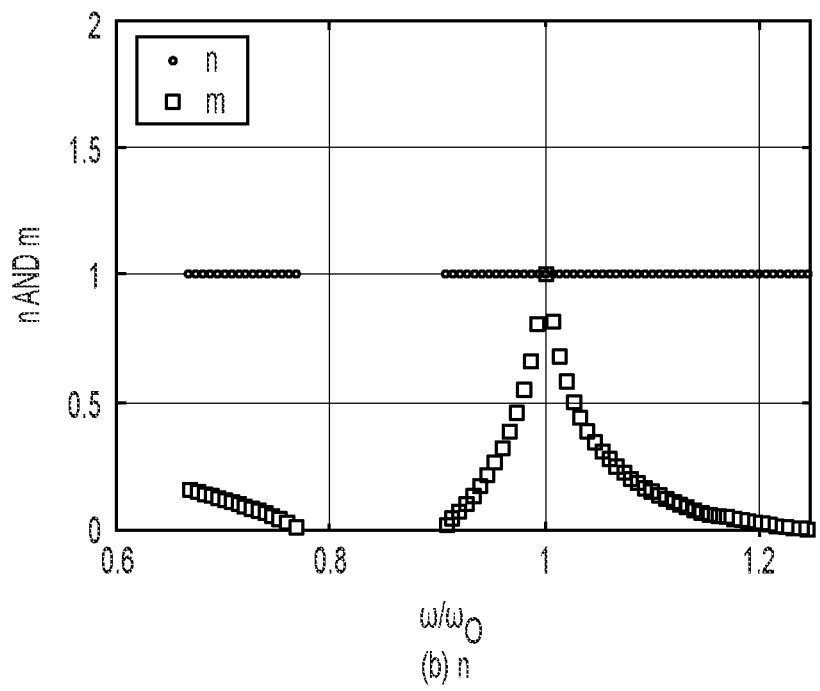
Figure 2C:
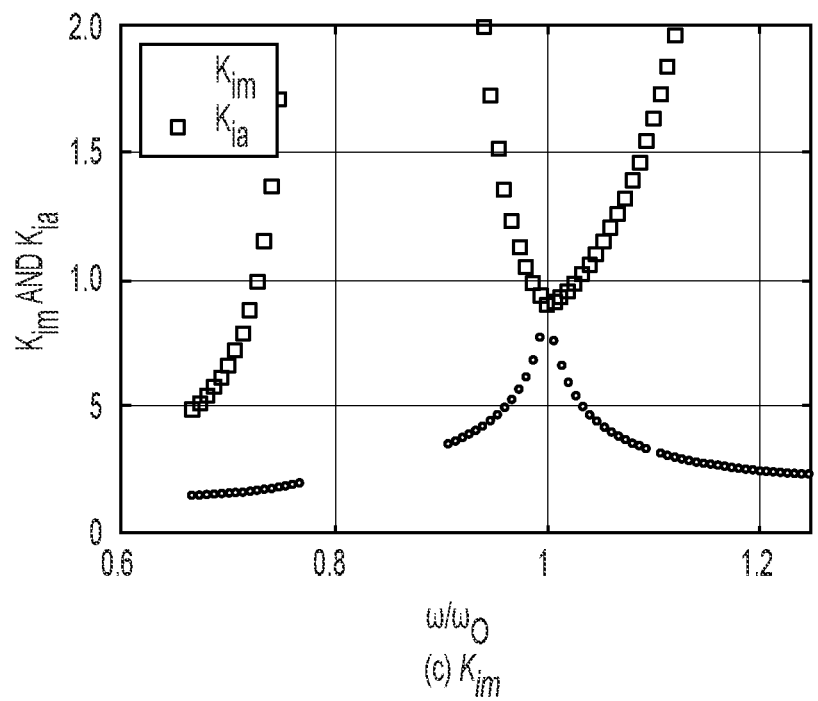
Figure 2D:
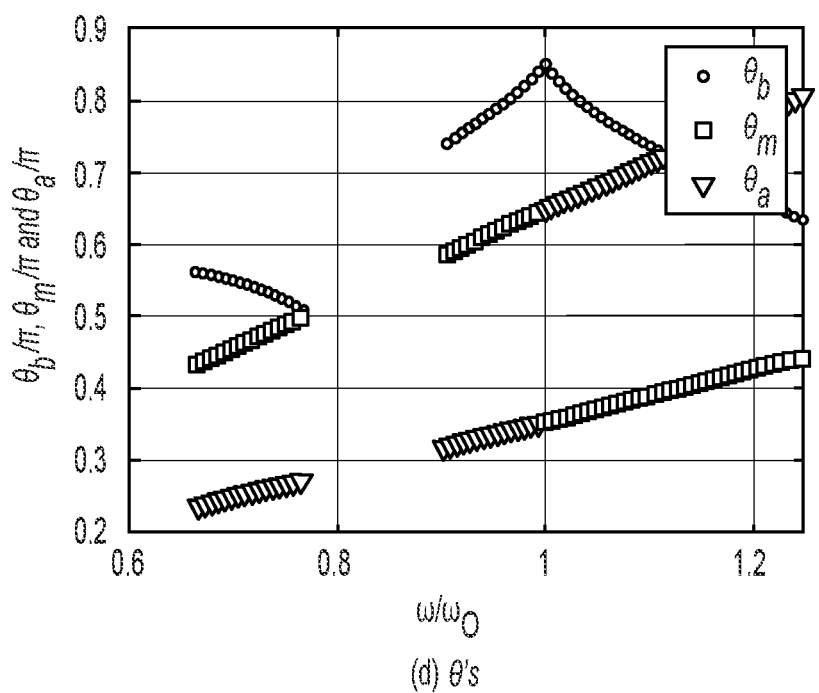
Figure 2E:
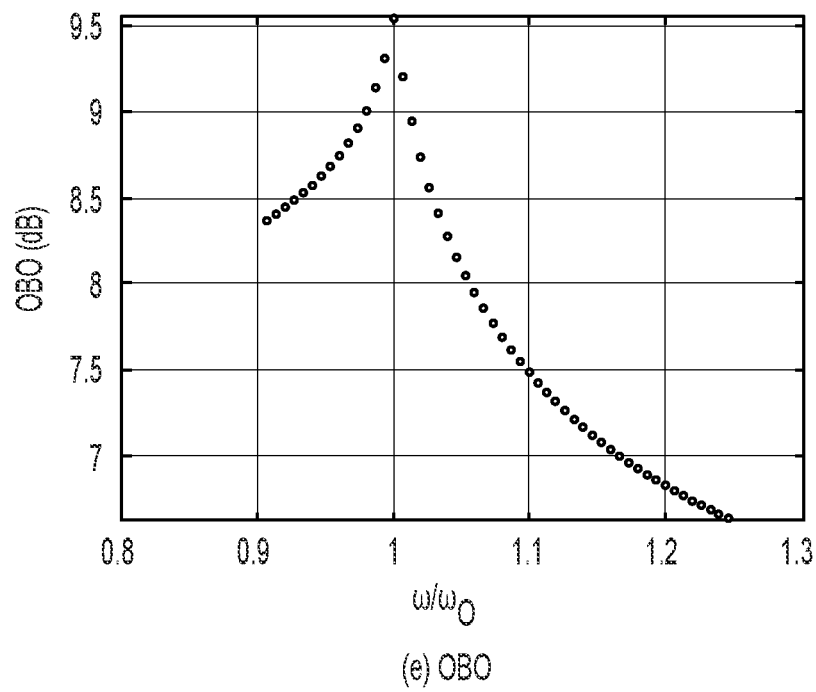
Figure 2F:
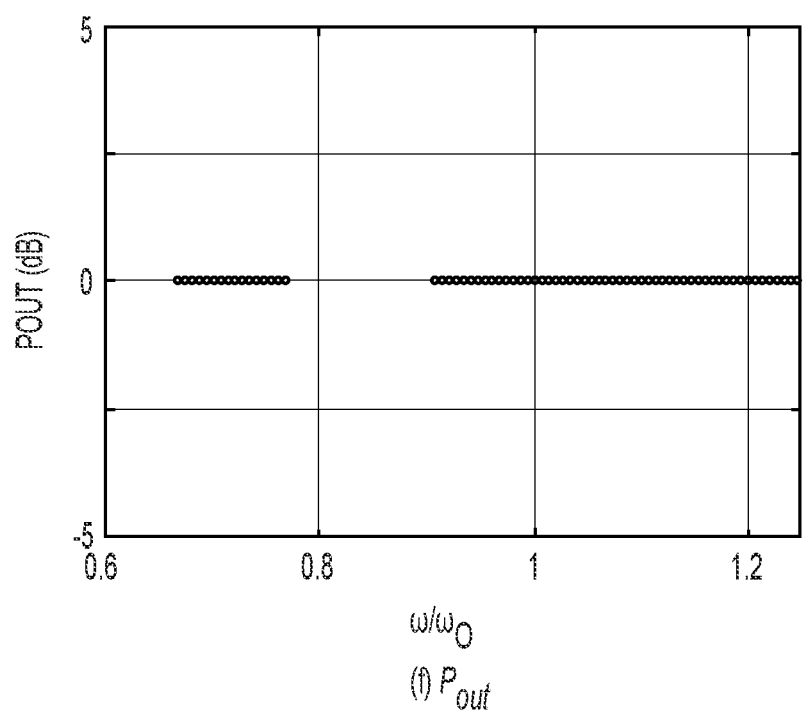

The following description of the disclosure is provided as an enabling teaching of the disclosure in its best, currently known embodiment(s). To this end, those skilled in the relevant art will recognize and appreciate that many changes can be made to the various embodiments of the disclosure described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Unless defined otherwise, all technical and scientific terms used herein have the same meaning as commonly understood to one of ordinary skill in the art to which this disclosure belongs. As used in the specification and claims, the singular form "a," "an," and "the" include plural references unless the context clearly dictates otherwise. As used herein, the terms "can," "may," "optionally," "can optionally," and "may optionally" are used interchangeably and are meant to include cases in which the condition occurs as well as cases in which the condition does not occur. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein. Publications cited herein are hereby specifically incorporated by reference in their entireties and at least for the material for which they are cited.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

Overview

The present disclosure describes a new dual-input microwave power amplifier (PA) with high-efficiency. This PA exploits the continuum of modes between the Doherty and Chireix PA mode of operation to achieve 40% fractional bandwidth while relying on the physical linear dispersion of the transmission lines of the lossless output combiner. A constant output is achieved at peak power over the entire bandwidth. The output backoff varies from 6 dB in the Doherty mode to 8 dB in the Chireix mode. A demonstrator circuit is implemented in a Qorvo GaN 0.15 micron integrated circuit process using Keysight ADS (Advanced Design System) for a frequency operating range varying from 4 to 6 GHz. In this band, the PA achieves in average 45% drain efficiency at peak power and 40% drain efficiency in backoff. The PA operates well over a wider range of frequencies from 1 to 8 GHz. The dual-input PA operates in mixed-mode and thus requires variable input power drives and outphasing angle. A four input implementation is also presented to allow the final sliding mode PA stage to operate in the high efficiency mixed mode while using constant power levels at the four inputs. This new PA provides a high efficiency for an exceptional large fractional bandwidth.

Sliding Mode Pa Theory

Dual-Input Broadband Power RF Amplifiers Theory

Below, the theory for a realization of a broadband dual-input amplifier relying on a mode of operation sliding is described. The topology at the current-source reference planes of the transistors for this dual-input amplifier is shown in FIG. 1.

Complex fundamental voltages, currents amplitudes of the main (m) and auxiliary (a) transistors, the associated K-factors are defined as:

$$|V_{mp}| = K_{vm}|V_{mb}|,$$
$$|I_{mp}| = K_{im}|I_{mb}|,$$
$$|V_{ap}| = K_{va}|V_{ab}|,$$
$$|I_{ap}| = K_{ia}|I_{ab}|.$$

It is assumed here that the active loads experienced by the transistors are all real:

$$R_{mp} = \frac{V_{mp}}{I_{mp}} = \frac{|V_{mp}|}{|I_{mp}|} = \frac{K_{vm}}{K_{im}}\frac{|V_{mb}|}{|I_{mb}|} = \frac{K_{vm}}{K_{im}}R_{mb},$$

$$R_{ap} = \frac{V_{ap}}{I_{ap}} = \frac{|V_{ap}|}{|I_{ap}|} = \frac{K_{va}}{K_{ia}}\frac{|V_{ab}|}{|I_{ab}|} = \frac{K_{va}}{K_{ia}}R_{ab}.$$

The impedance transformation of a lossless line of characteristic impedance $Z_0$ and electrical length $\theta$ which is terminated by the load $Z_L$ is known to be:

$$Z_{in} = Z_0\frac{Z_L + jZ_0\tan\theta}{Z_0 + jZ_L\tan\theta}.$$

For $Z_L=Z_0$ it is understood that the $Z_{in}=Z_0$. This holds for all $\theta$ and thus there is broadband impedance match. Similarly, for $Z_L=-Z_0$ (active impedance) the result that $Z_{in}=-Z_0$ for all $\theta$ is obtained. Thus, there is impedance matching for all $\theta$.

Given a peak power:
$V_{mp}'=e^{-j\theta_m}V_{mp}$, $I_{mp}'=e^{-j\theta_m}I_{mp}$, $V_{ap}'=e^{-\theta_a}V_{ap}$, $I_{ap}'=e^{-j\theta_a}I_{ap}$; with $\theta_m$ and $\theta_a$ the line electrical lengths, the peak load current is then:

$$I_{Lp} = \frac{V_{Lp}}{R_L} = I_{mp}' + I_{ap}' = \frac{V_{Lp}}{R_{mp}} + \frac{V_{Lp}}{R_{ap}},$$

which leads to $R_L = R_{mp}/R_{ap}$:

$$\frac{1}{R_L} = \frac{1}{R_{mp}} + \frac{1}{R_{ap}}.$$

The auxiliary to main peak power ratio n is itself given by:

$$n = \frac{P_{ap}}{P_{mp}} = \frac{V_L I_{ap}'}{V_L I_{mp}'} = \frac{R_{mp}}{R_{ap}}$$

The Doherty PA is obtained by setting $R_{ab}=\infty$ and the desired n ratio. The Chireix PA is obtained by setting $R_{mp}=R_{ap}=R_p$ and $R_{mb}=R_{ab}=R_b$. The significance of these new design equations is that they reveal that the transmission line combiner provides a broadband implementation for the peak power. The condition under which a broadband implementation is realized by the transmission line combiner at backoff is studied next by looking at the two continuum trajectories between the Doherty and HDmax modes and the Chireix and the HDmax modes. As the frequency varies, the electrical lengths of the lines varies linearly according to:

$$\theta_m = \theta_{m0}\frac{\omega}{\omega_0}, \quad (1.1)$$

$$\theta_a = \theta_{n0}\frac{\omega}{\omega_0}, \quad (1.2)$$

assuming that $\theta_{a0}$ is kept positive by adding $2\pi$ or $\pi$. The mode at $\omega_0$ can be any mode. In the case of a Doherty mode, for example:

$$\theta_{m0} = \frac{\pi}{2},$$

$$\theta_{a0} = \pi.$$

Chireix-HDmax Continuum

Consider now a Chireix-HDmax continuum to explore the design space it offers to achieve a constant output power while the electrical length of the transmission lines linearly scales with frequency.

The system of equations to solve is:

$$\tan(\theta_m) = \frac{K_{im}(K_{im}-1)}{K_{ia}+K_{im}}\tan\theta_b,$$

$$\tan(\theta_a) = \frac{K_{ia}(K_{va}-K_{im})}{K_{va}(K_{ia}+K_{im})}\tan(\theta_b),$$

$$n = \frac{1/K_{im}-1}{1/K_{ia}-1/K_{va}} = 1.$$

After some algebra the solution of this system of equation is given by the roots of a third order polynomial:

$$P_3 K_{ia}^3 + P_2 \cdot K_{ia}^2 + P_1 K_{ia}^1 + P_0 = 0,$$

with $P_0 = +AI - G,$
$P_1 = AH + BI - F,$
$P_2 = BH + CI - E,$
$P_3 = CH - D,$ using the coefficients:

$$A = \tan^2\theta_m\left(2 - \frac{1}{2}(1+R)\right)^2,$$

$$B = 2\tan^2\theta_m\left(2 - \frac{1}{2}(1+R)\right)\frac{1}{2}(1+R),$$

$$C = \tan^2\theta_m \frac{1}{4}(1+R)^2,$$

$D = 3 + 2R - R^2,$ $E = 1 - 4R + 3R^2,$ $F = -3 + 2R - 3R^2,$ $G = R^2 - 1,$ $H = -4R,$ $I = 4(1+R),$ $$R = \frac{\tan\theta_a}{\tan\theta_m}.$$

Only one root for $K_{ia}$ is found to be positive in practice. Once $K_{ia}$ is obtained the rest of the coefficients are then obtained using:

$$K_{vm} = \frac{2K_{ia}}{1+R+K_{ia}(1-R)},$$

$$\frac{1}{K_{im}} = \frac{1}{K_{ia}} - \frac{1}{K_{va}} + 1,$$

$$\theta_b = \pm\cos^{-1}\left(\pm\sqrt{\frac{(K_{ia}-1)(K_{va}(1+n)-K_{va}^2)}{(K_{ia}+K_{va})(2K_{va}-n)}}\right).$$

This provides a general solution for the constant power (n=1) outphasing PA realized with a transmission line coupler.

FIGS. 2A-2F illustrate a distribution of $K_{va}$, n, $K_{im}$, $\theta_b$, $\theta_m$, $\theta_a$, normalized $P_{out}$, and OBO for PA mode centered on a Chireix mode ($K_{im}=1$) at $K_{im}$. Consider next the case in FIGS. 2A-2F, a Chireix mode exists at $\omega_0$. A bandwidth of 32.5% from 0.9 to 1.25 is achieved while maintaining a constant output power and an output back-off (OBO) above 6.5 dB. The Chireix mode is usually considered to be narrowband. The constant power (n=1) continuum between the Chireix and HDmax modes provides for some welcomed bandwidth extension.

Sliding Mode Theory Power Amplifier (PA) Design

Figure 3:
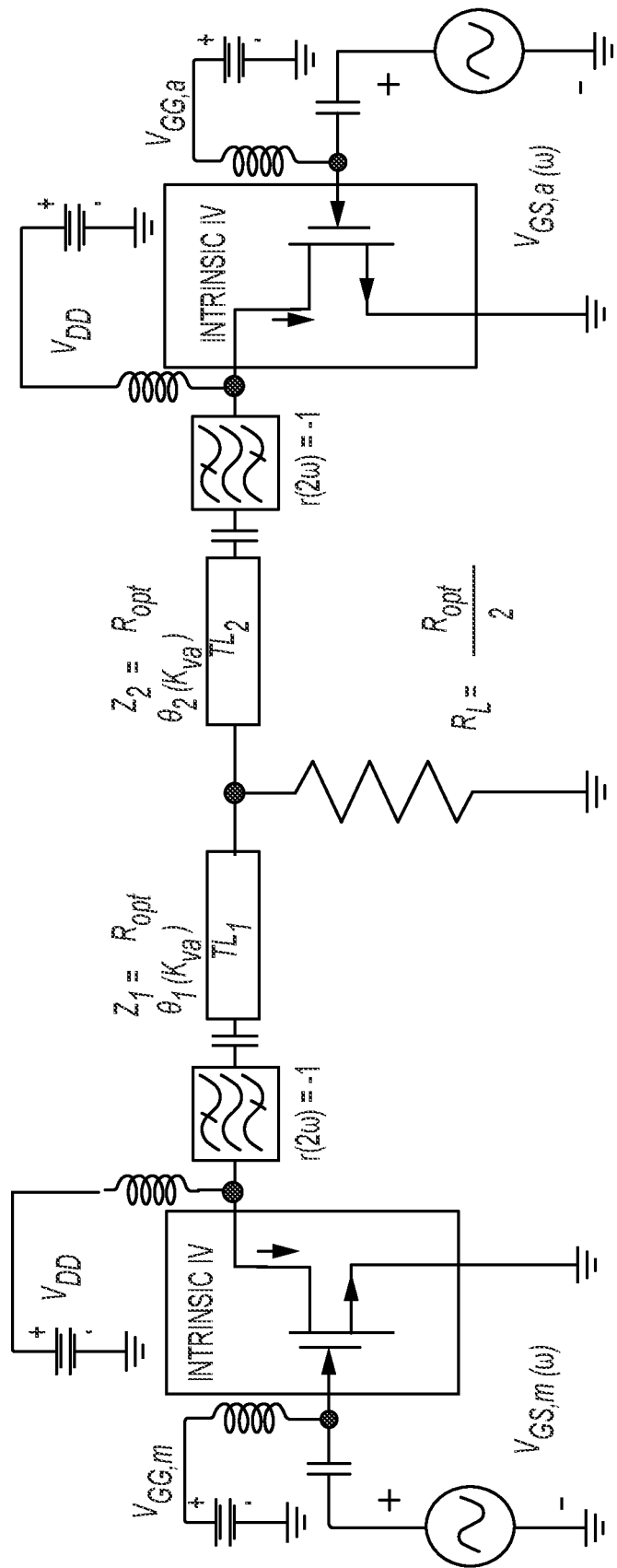
FIG. 3 illustrates an example Sliding Mode Theory Power Amplifier (PA)

With reference to FIG. 3, the Sliding Mode Theory Power Amplifier (PA) is designed using the prototype/reference circuit shown in FIG. 3 at the current source reference planes (IV) of the devices. The circuit topology of FIG. 3 illustrates a dual transistor PA in which the output of each transistor IV is combined together by transmission lines and a common load, denoted $R_L$. The transmission line labeled $TL_1$ will be referred to as the "main branch" and the transmission line labeled $TL_2$ will be referred to as "auxiliary branch" throughout this document. This naming convention is similar to the traditional Doherty Outphasing naming convention with Carrier being "Main" and Peaking being "Auxiliary".

The Sliding Mode PA is targeted to operate in the Doherty mode of operation with 6 dB of OBO at the maximum frequency when the outphasing angle between the two inputs is equal to 90° which occurs when $\omega=\omega_0$. As the frequency of operation deviates from $\omega_0$, the mode operation gradually changes from a Doherty mode of operation to a Chireix mode of operation with 8 dB of OBO at the minimum frequency. The Sliding Mode operation is enabled by properly mapping the electrical length variation of transmission lines $TL_1$ and $TL_2$ across the targeted frequency band of operation with the required outphasing angle needed to achieve the desired mode of operation. The theory for the sliding mode operation is detailed above.

The transmission lines are designed so the characteristic impedance of the transmission line is $Z=R_{opt}$ where, $R_{opt}$ is the optimal impedance as determined by the Intrinsic I-V load-line of the chosen device. The electrical lengths of transmission lines are designed with the following relationship:

$$\Theta_{1/2} = \Theta_{O_{(1,2)}} \frac{\omega}{\omega_O},$$

with $$\Theta_{O_1} = \frac{\pi}{2},$$

$\Theta_{O_2}=\pi$, $\omega=2\pi f$, where f is a frequency of operation, $\omega_o=2\pi f_H$, where $f_H$ is the maximum frequency in the desired operating frequency range. For example, in a recently submitted RF GaN Design Challenge, $f_H$=6 GHz as the targeted operating frequency range is 4 GHz-6 GHz meaning that $\theta_{o1}$ will range from 60° to 90° as the operating frequency ranges from 4 GHZ-6 GHz. Similarly, $\theta_{o2}$ will range from 120° to 180° as the operating frequency ranges from 4 GHz-6 GHz. In addition to providing an impedance $R_{opt}$ to the devices, the main and auxiliary branch transmission lines must also provide the proper second harmonic termination for Class-B power amplifier operation. Textbook Class-B waveforms dictate that the harmonics greater than the fundamental harmonic should be shorted out from the output, and as such the main and auxiliary transmission lines must also provide the appropriate harmonic termination for at least the second harmonics of the operating frequency range.

A unique feature of the Sliding Mode Power Amplifier is that the design of the matching networks is established at the current-source reference plane (CSRP). Designing matching networks from the CSRP can be facilitated through the use of a non-linear embedding model, a non-linear de-embedding model, or even a linear de-embedding circuit. The benefit of designing matching networks from the CSRP is that it gives the designer insight into the intrinsic operation of the device as opposed to traditional multi-harmonic load-pull and source-pull simulations. As the various textbook power amplifier waveforms are described from the intrinsic I-V of transistors, providing designers access to the operation of the intrinsic I-V is critical for high performance power amplifiers especially at higher operating frequencies.

One method to extract the output parasitic network is to use a recently developed extraction technique termed the Joint Hot/Cold-FET extraction technique. The Joint Hot/Cold-FET extraction technique uses the widely accepted Cold FET extraction technique to extract the device manifold. Once the manifold reference plane (MRP) of the device is extracted, the Hot FET component of the extraction technique is leveraged by biasing the device in a conducting, or hot state and extracting the extrinsic output parasitic to obtain an accurate parasitic model of the transistor to be used in the power amplifier design.

Figure 4:
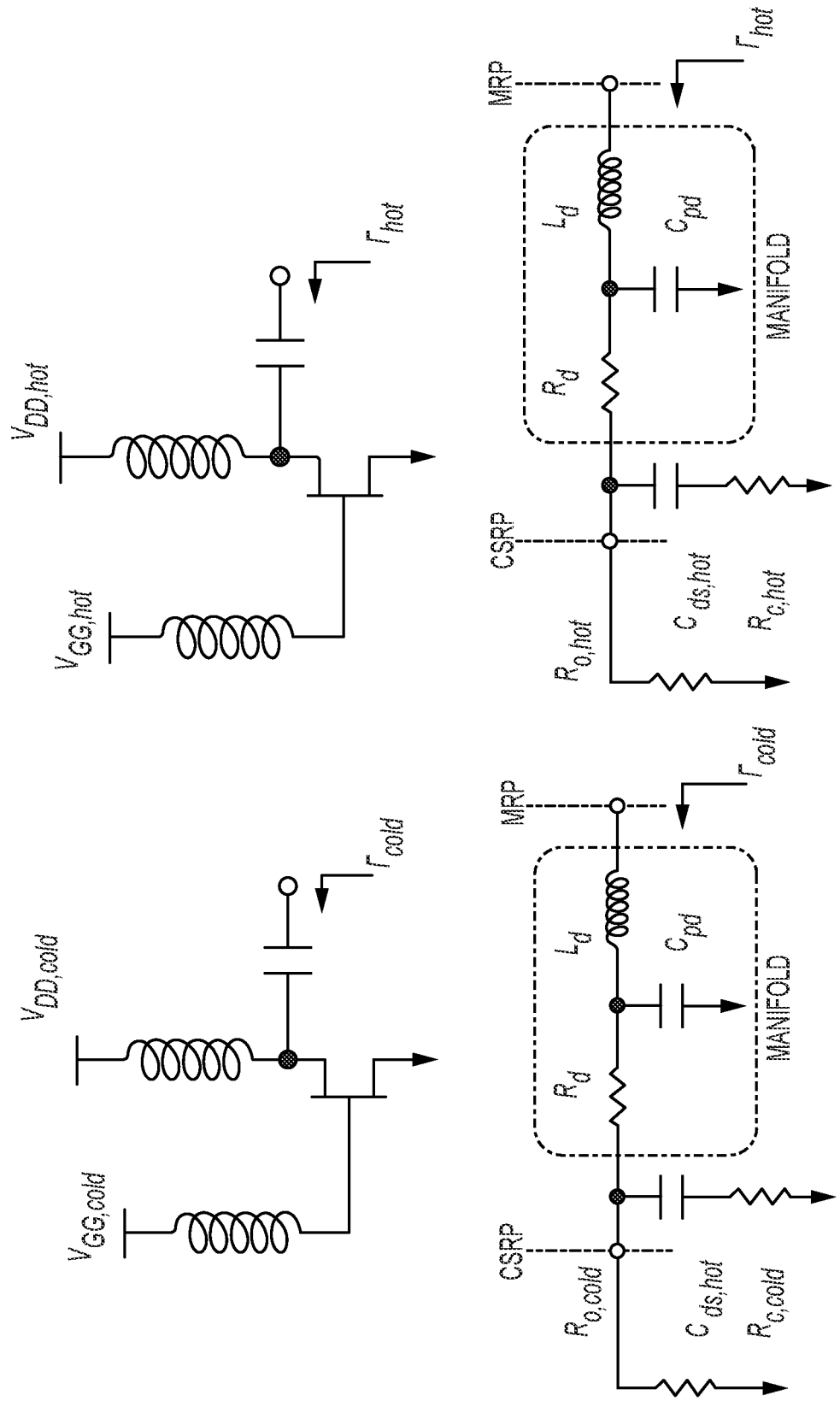
FIG. 4 illustrates example small-signal equivalent circuits for the Joint Hot/Cold-FET extraction and device setup for extraction.

FIG. 4 illustrates small-signal equivalent circuits for the Joint Hot/Cold-FET extraction and device setup for extraction. Shown in FIG. 4 are the small-signal equivalent circuits for the Hot and Cold FET extractions. Illustrated in FIG. 4 are the small-signal parameters for the Hot and Cold parasitic networks and the transistors the networks are targeting to model.

Figure 5:
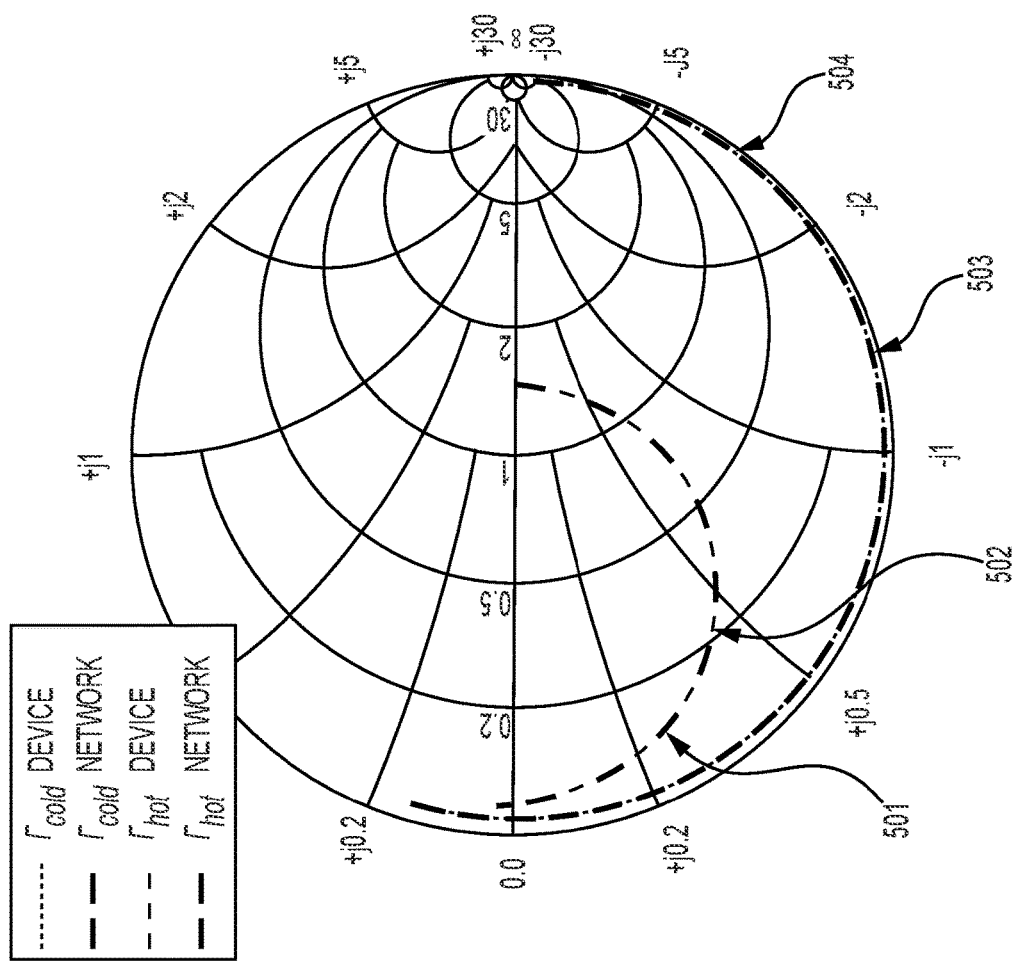
FIG. 5 illustrates example small-signal parameters for the Hot and Cold parasitic networks and devices biased in the Cold and Hot states from 0.1-72 GHz.

FIG. 5 illustrates small-signal parameters for the Hot and Cold parasitic networks and devices biased in the Cold and Hot states from 0.1-72 GHz. Shown in FIG. 5 are the small-signal parameters for the Hot and Cold parasitic networks compared to the small-signal parameters of the transistors biased in an off state and on state. The Hot parasitic network is shown in FIG. 5 by the curve identified by reference numeral 501 while the device biased in the conducting state is shown by the curve identified by reference numeral 502. The Cold parasitic network is shown by the curve identified by reference number 503 while the device biased in an off state is shown by the curve identified by reference number 504. As one can see looking at FIG. 5, the parasitic network extracted exclusively using the Cold FET technique (cure 503) does a very poor job modeling the device while it is conducting (curve 502). However, the parasitic network using the Joint Hot/Cold-FET extraction technique (curve 501) can be seen to model the device while biased in a conducting state quite accurately (curve 502).

Figure 6:
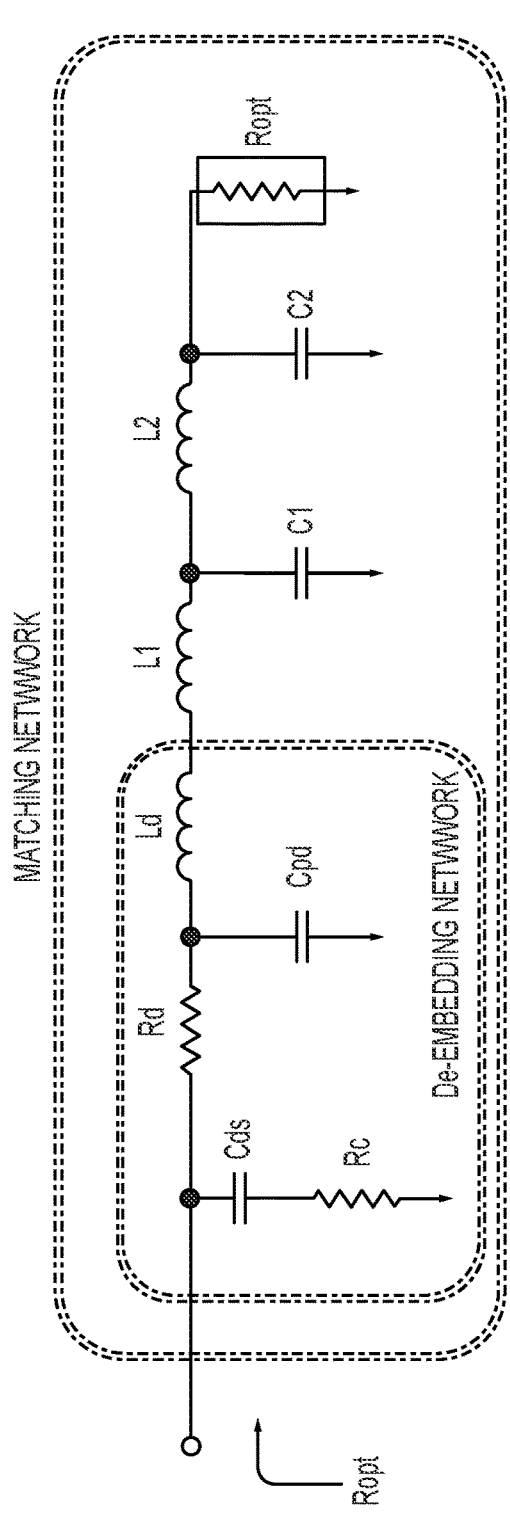
FIG. 6 illustrates an example main branch network design.
Figure 7:
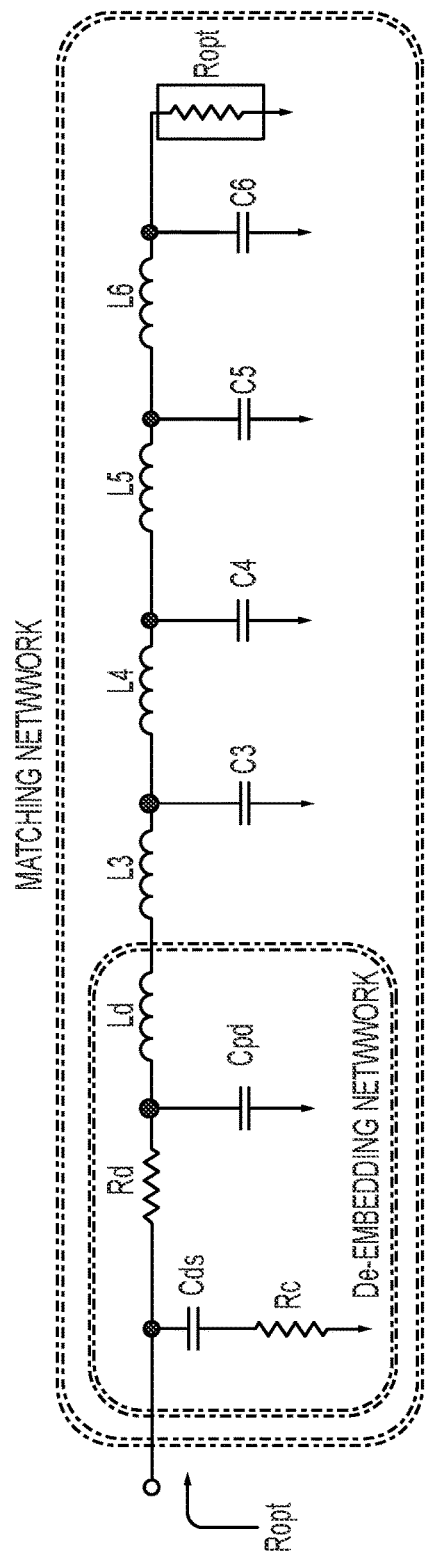
FIG. 7 illustrates an example auxiliary branch matching network design.

With an accurate de-embedding model, the output matching networks can be designed from the current-source reference plane. An advantage of designing from the current-source reference plane, is the ability to include the frequency-dependent parasitic network of the device into the design of the output matching network. As a result, an output matching network may be designed with a specific mode of operation as the target, for example a Class-B operation. FIG. 6 illustrates a main branch network design. FIG. 7 illustrates an auxiliary branch matching network design. FIGS. 6 and 7 show the process of including the deembedded parasitic network into the design of the output matching network.

As stated above, the design targets for the main and auxiliary branches are the proper electrical length variation across the operating frequency, and the correct characteristic impedance, $R_{opt}$. The electrical length variation for the main branch was targeted to vary from 60° to 90° as the operating frequency ranges from 4 GHz-6 GHz and the electrical length variation for the auxiliary branch was targeted to vary from 120° to 180° as the operating frequency ranges from 4 GHz-6 GHz. The characteristic impedance for the main and auxiliary branches were both targeted to achieve $R_{opt}$ which was determined to be 50 ohms from DC-IV simulations. In addition to the targeted electrical length variation across frequency and the characteristic impedance, the main and auxiliary branches were designed to include the proper second harmonic termination to achieve a short-circuit impedance at the current-source reference plane as described by the traditional Class-B mode of operation for power amplifiers.

Figure 8:
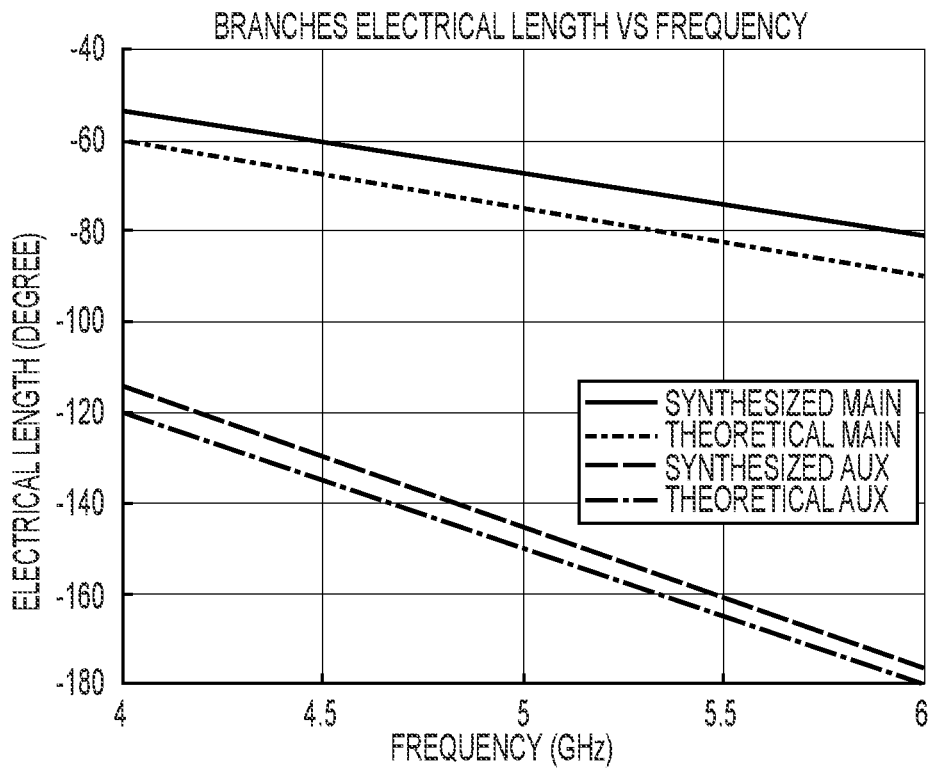
FIG. 8 illustrates an example electrical length variation across frequency for the main and auxiliary branches.
Figure 9:
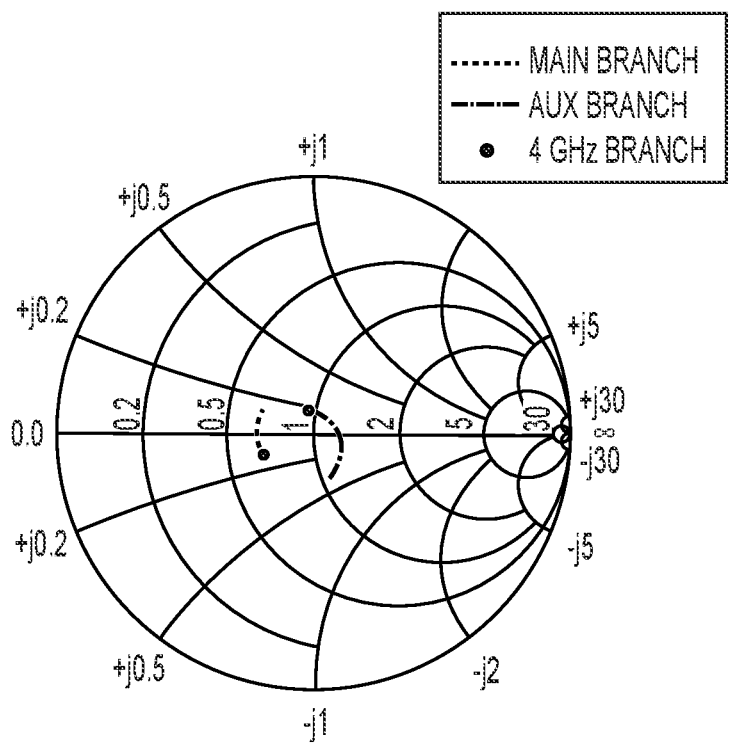
FIG. 9 illustrates an example input impedance of the main and auxiliary branches from 4-6 GHz.

FIG. 8 illustrates electrical length variation across frequency for the main and auxiliary branches. Shown in FIG. 8 is the electrical length variation across frequency for both the main and auxiliary branches. FIG. 9 illustrates input impedance of the main and auxiliary branches from 4-6 GHz. Shown in FIG. 9 is the input impedance of both the main and auxiliary branches plotted on a Smith chart.

Furthermore, the Sliding Mode PA utilizes a common load, $R_L$, terminated in between the main and auxiliary branch transmission lines. The purpose of the load resistor is to maintain an optimal impedance for the main and auxiliary transistors while the delivered output power of the PA varies from the peak output power to the back-off output power, in addition to providing the DC drain biasing for the power amplifier.

Figure 10:
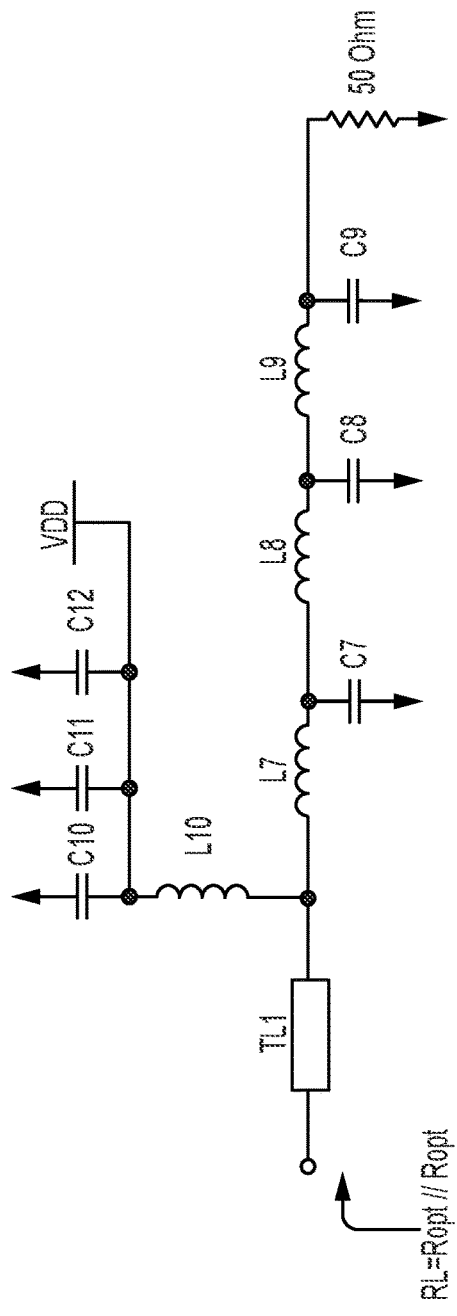
FIG. 10 illustrates an example schematic of output transformer converting 50 ohms to $R_L$.
Figure 11:
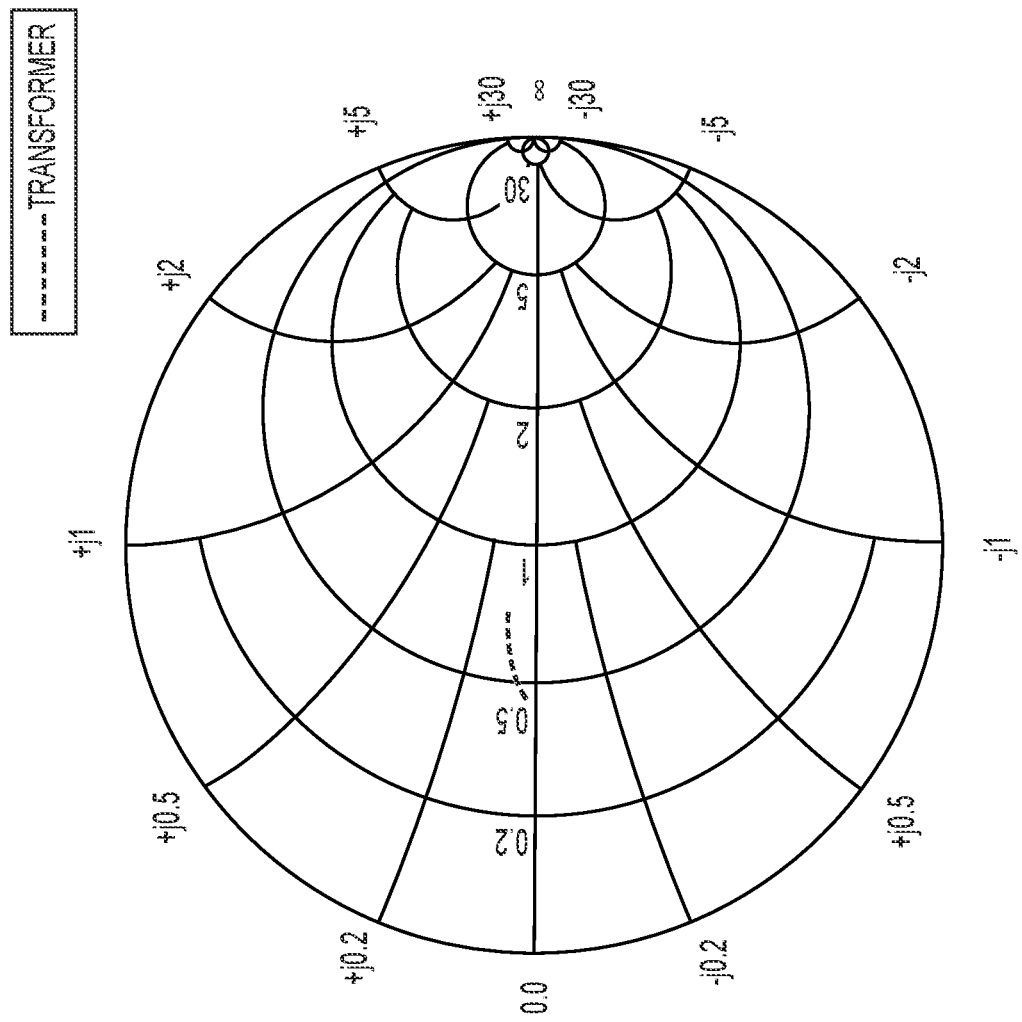
FIG. 11 illustrates an example input impedance of the output transformer from 4-6 GHz.

FIG. 10 illustrates a schematic of output transformer converting 50 ohms to $R_L$. Shown in FIG. 10 is the schematic of the designed output transformer that converts 50 ohms to the common load, $R_L$. The common load, $R_L$, is determined to be $$\frac{R_{opt}}{2}$$

through circuit analysis. Since $R_{opt}$ is determined to be 50 ohms, the common load, $R_L$, is to convert 50 ohms to 25 ohms. FIG. 11 illustrates input impedance of the output transformer from 4-6 GHz. Shown in FIG. 11 is the input impedance of the output transformer which is designed to be 25 ohms. Lastly, an input matching network is implemented to provide a broadband match for the input of the power amplifier while also providing the DC biasing for the gates of the transistors.

As RF transmitter systems are increasingly being integrated into smaller packaging options, the design choice to use integrated transmission lines for the design of the Sliding Mode PA may become less feasible. Depending on the operating frequency for the intended power amplifier and allotted wafer design space, a designer may be forced to use lumped-elements components to implement the matching networks required for proper power amplifier operation. The impedance of a transmission line can be defined as:

$$Z_o = R \approx \sqrt{\frac{L}{C}}$$

As such, the synthesis of the matching networks for the Sliding Mode PA does not need to change whether designing with lumped-element components or integrated transmission lines.

Figure 12:
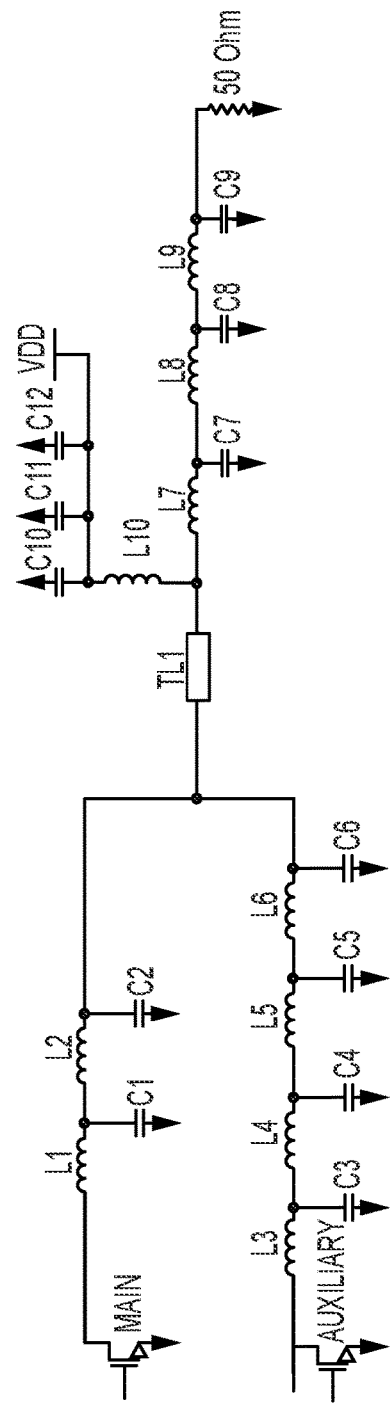
FIG. 12 illustrates an example output matching network schematic.

FIG. 12 illustrates an example output matching network schematic. Shown in FIG. 12 is the electrical schematic for the full output matching network. This includes both the main and auxiliary branches in addition to the output transformer.

Figure 13:
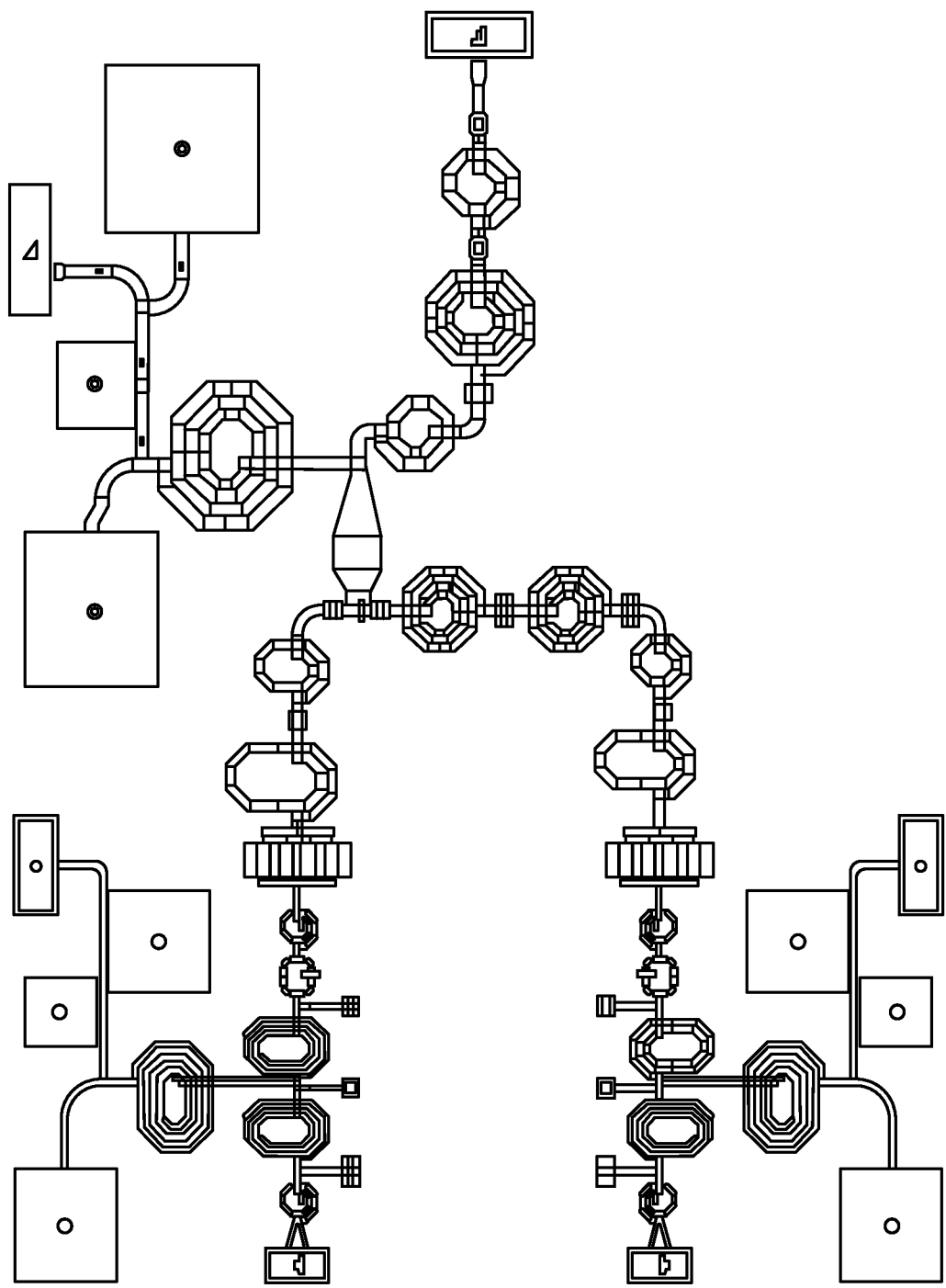
FIG. 13 illustrates an example sliding Mode PA integrated into a GaN MMIC.

Shown below are performance results of the recently designed and integrated Sliding Mode Power Amplifier. The integrated Sliding Mode PA is operational in two frequency bands. Frequency band one is termed the high-performance band which includes frequencies from 4 GHz-6 GHz. The second operational frequency band is termed the extended band. The extended operating band includes frequencies from 1 GHz-8 GHz. FIG. 13 illustrates an example sliding Mode PA integrated into a GaN MMIC.

Figure 14A:
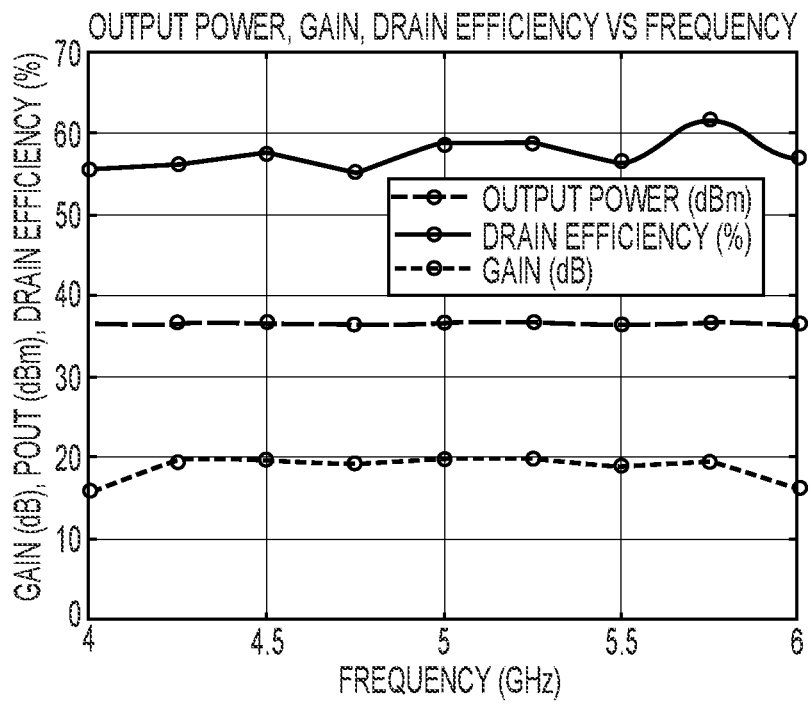
FIG. 14A illustrates Output power (dBm), Drain Efficiency (%), Gain (dB) at the Current-Source Reference plane.
Figure 14B:
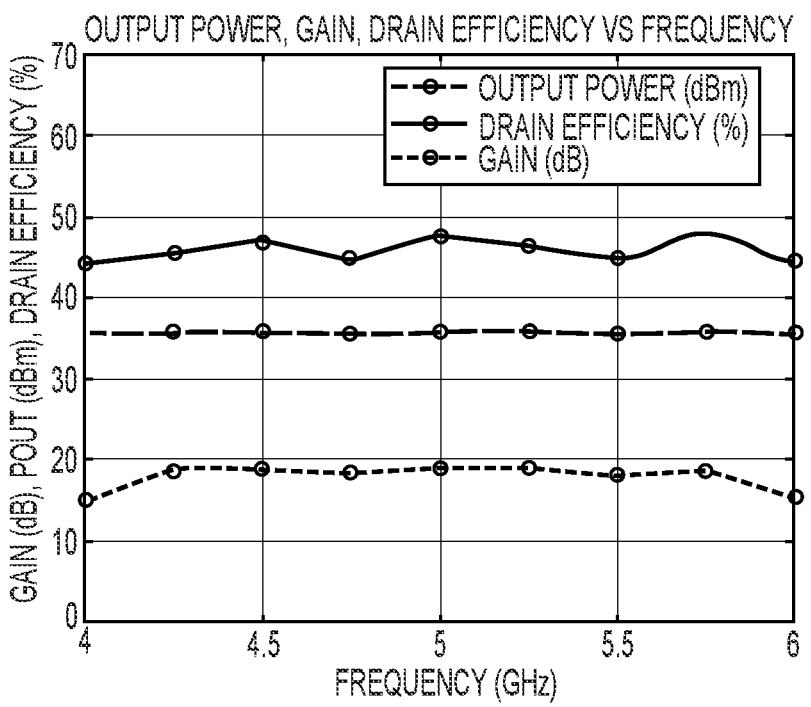
FIG. 14B illustrates Output power (dBm), Drain Efficiency (%), Gain (dB) at the 50-ohm load reference plane.

High-Performance Operating Band:

The demo Sliding Mode PA is an amplifier operating from 4-6 GHz, with a fractional bandwidth of 40%. The peak output power is approximately 37 dBm, while the back-off output power ranges from 29 dBm at 4 GHz, to 31 dBm at 6 GHz. Therefore, the output back-off range is 6-8 dB depending on the frequency of operation. FIG. 14A illustrates Output power (dBm), Drain Efficiency (%), Gain (dB) at the Current-Source Reference plane. FIG. 14B illustrates Output power (dBm), Drain Efficiency (%), Gain (dB) at the 50-ohm load reference plane. Plotted in FIGS. 14A-14B are the output power, drain efficiency and gain at peak output power at the current source reference plane (CSRP) and 50-ohm load reference plane. The performance at the current source reference plane was determined using a non-linear device model that provided intrinsic node inspection.

The motivation behind plotting the performance the CSRP and also at the 50-ohm load reference plane is to illustrate the loss experienced by the synthesized output matching network. Due to the quality of inductors and capacitors provided by the process design kit (PDK), the loss measured due to the output matching networks ranges from 1.0-1.5 dB of power loss from the CSRP to the 50-ohm load.

Figure 15A:
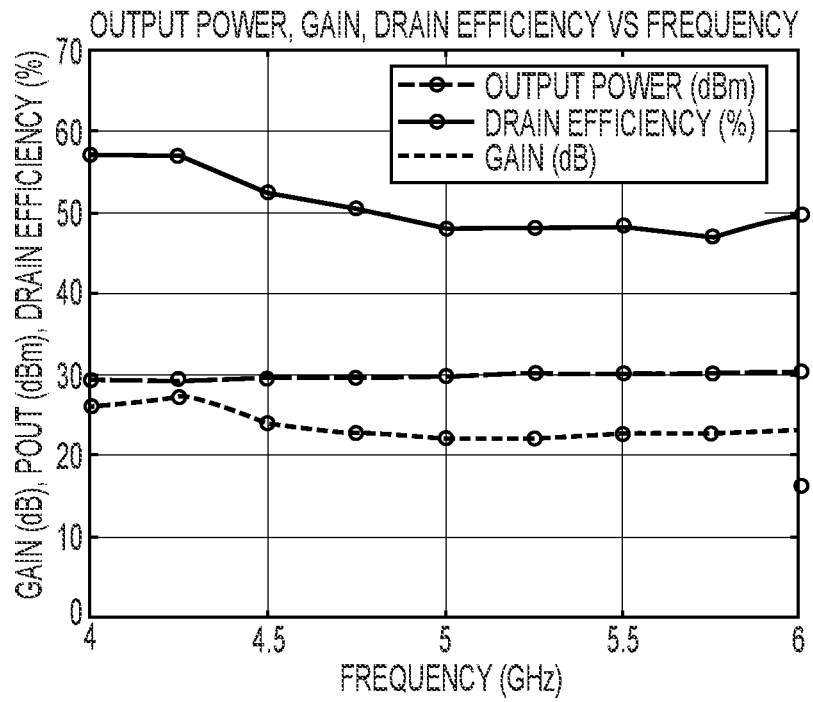
FIG. 15A illustrates Output power (dBm), Drain Efficiency (%), Gain (dB) at the Current-Source Reference plane.
Figure 15B:
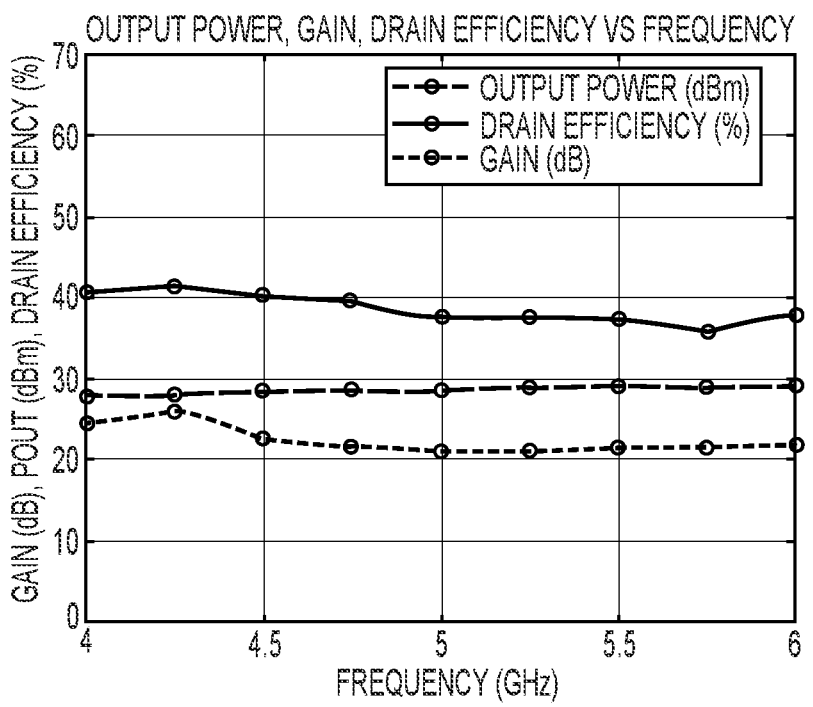
FIG. 15B illustrates Output power (dBm), Drain Efficiency (%), Gain (dB) at the 50-ohm load reference plane.

FIG. 15A illustrates Output power (dBm), Drain Efficiency (%), Gain (dB) at the Current-Source Reference plane. FIG. 15B illustrates Output power (dBm), Drain Efficiency (%), Gain (dB) at the 50-ohm load reference plane. Plotted in FIGS. 15A and 15B are the output power, drain efficiency and gain at back-off output power at the current source reference plane (CSRP) and 50-ohm load reference plane.

Figure 16A:
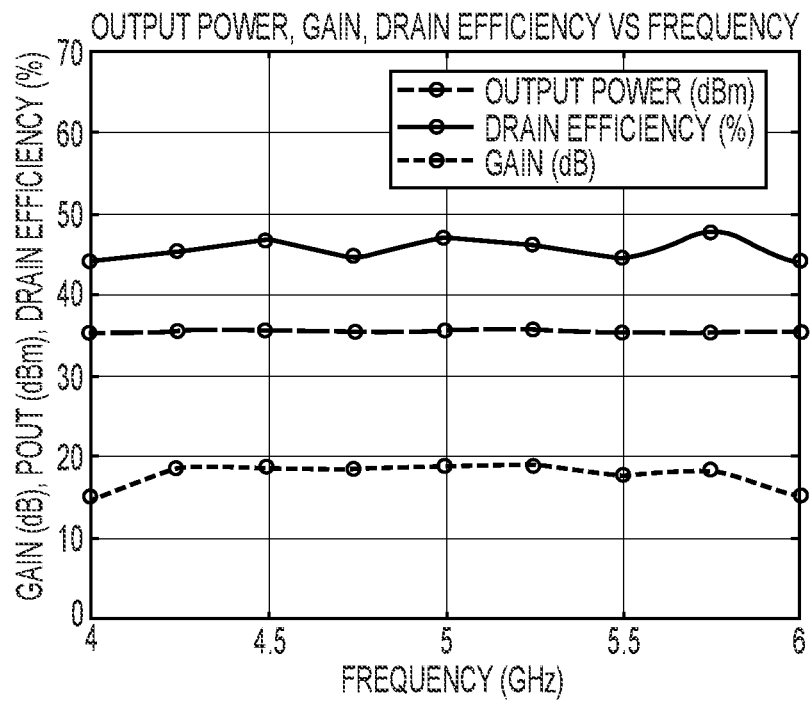
FIGS. 16A-16B illustrate the performance loss attributed to the synthesized output matching network.
Figure 16B:
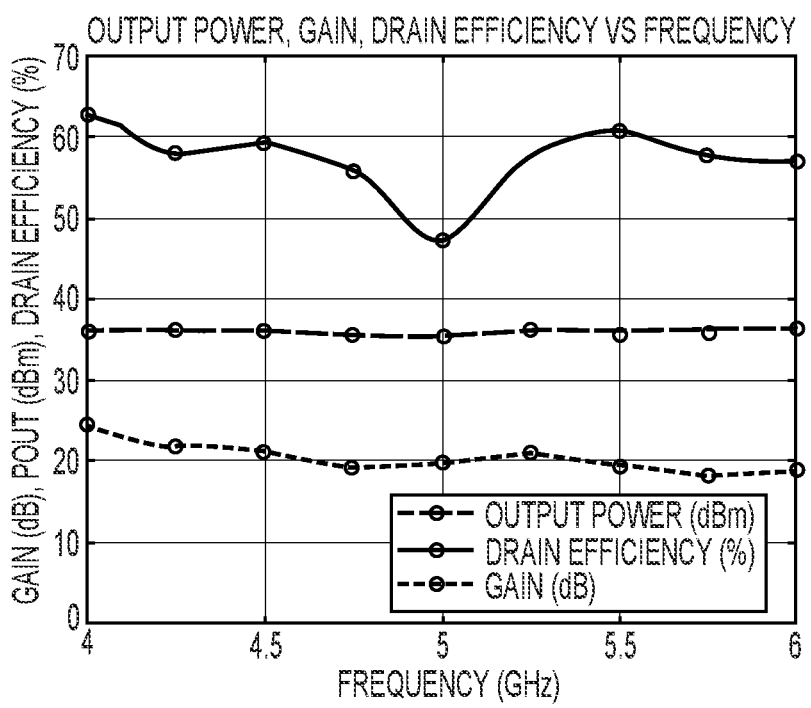

FIGS. 16A-16B illustrate the performance loss attributed to the synthesized output matching network. FIG. 16A illustrates Output power (dBm), Drain Efficiency (%), Gain (dB) at the 50-ohm load for the synthesized output matching network. FIG. 16B illustrates Output power (dBm), Drain Efficiency (%), Gain (dB) at the 50-ohm load for the ideal output matching network. FIG. 16B is the performance at peak power of the Sliding Mode PA using ideal inductors and capacitors provided by ADS for the output matching network. The output matching network designed using ideal inductors and capacitors helps illustrate the loss experienced by the inductors and capacitors used in the MMIC design. As one can see looking at FIG. 16A and FIG. 16B, the drain efficiency at the 50-ohm load reference plane using the ideal inductors and capacitors (FIG. 16B) is much larger than the drain efficiency at the 50-ohm load using the PDK's inductors and capacitors (FIG. 16A). This can be explained to the minimal loss experienced by the ideal output matching network. The output matching network designed using ideal inductors and capacitors only has approximately 0.25 dB of power loss. By comparison, the synthesized output matching network experiences a power loss of 1.0-1.5 dB due to the output matching network. As a result, the drain efficiency of the PA rises dramatically in the ideal output matching network design as compared to the output matching network designed using the PDK's inductors and capacitors.

Figure 17A:
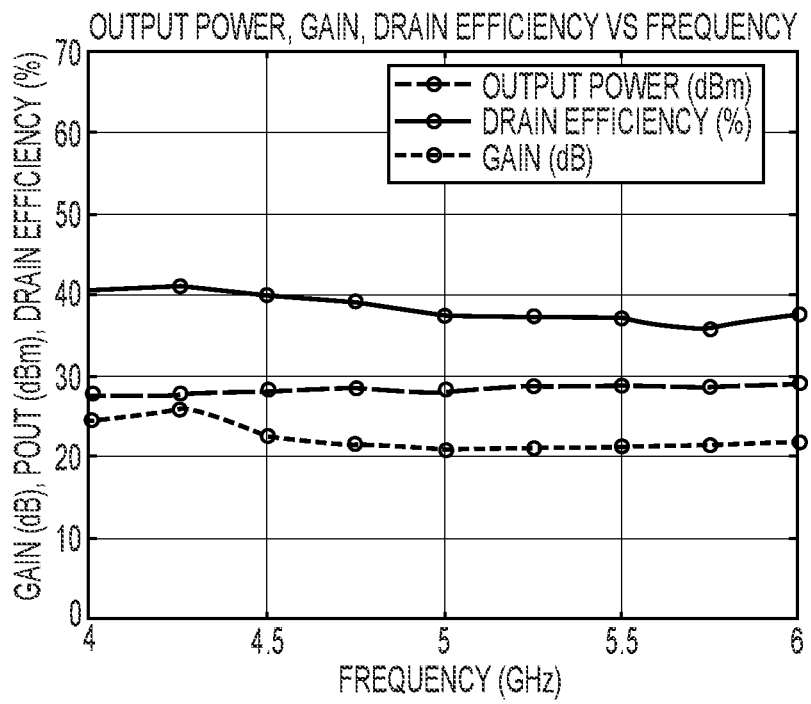
FIG. 17A illustrates Output power (dBm), Drain Efficiency (%), Gain (dB) at the 50-ohm load for the synthesized output matching network.
Figure 17B:
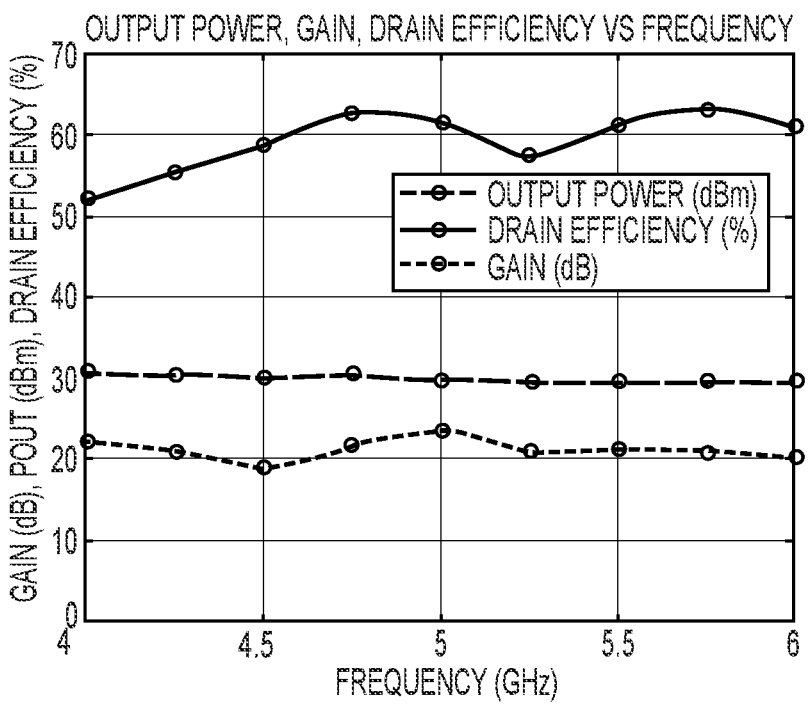
FIG. 17B illustrates Output power (dBm), Drain Efficiency (%), Gain (dB) at the 50-ohm load for the ideal output matching network.

Similarly, the performance results are plotted below at back-off output power. The results shown below illustrate the loss experienced by the synthesized output matching network in comparison to the loss experienced by the ideal output matching network. FIG. 17A illustrates Output power (dBm), Drain Efficiency (%), Gain (dB) at the 50-ohm load for the synthesized output matching network. FIG. 17B illustrates Output power (dBm), Drain Efficiency (%), Gain (dB) at the 50-ohm load for the ideal output matching network. One can see in the figures below that the loss is much larger for the output matching network designed using the PDK's inductors and capacitors. This is highlighted by the poor drain efficiency in FIG. 17A in comparison to the higher drain efficiency in FIG. 17B.

Figure 18A:
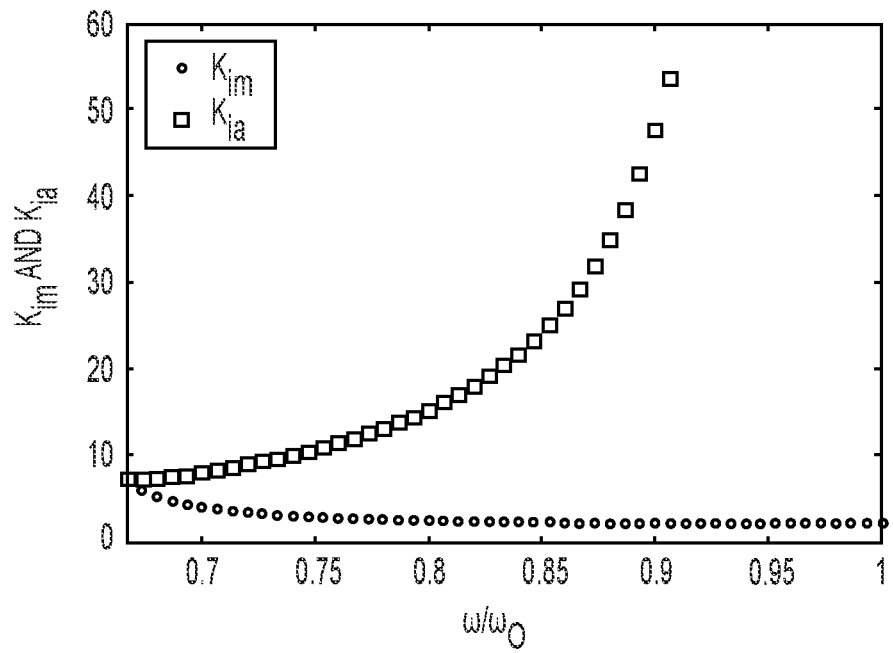
FIGS. 18A-18D illustrate example theoretical and simulated K-factors as derived in the supporting documentation.
Figure 18B:
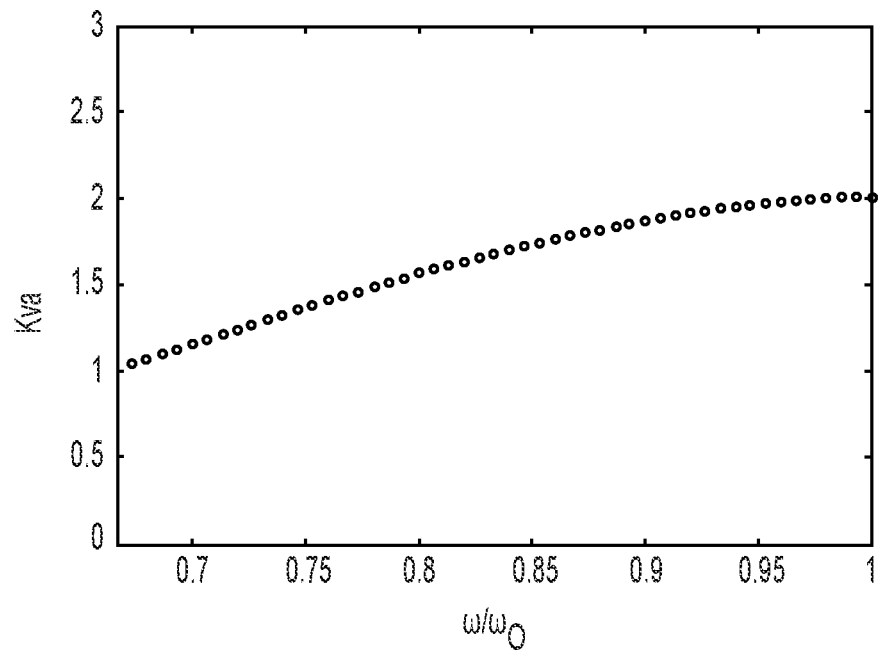
Figure 18C:
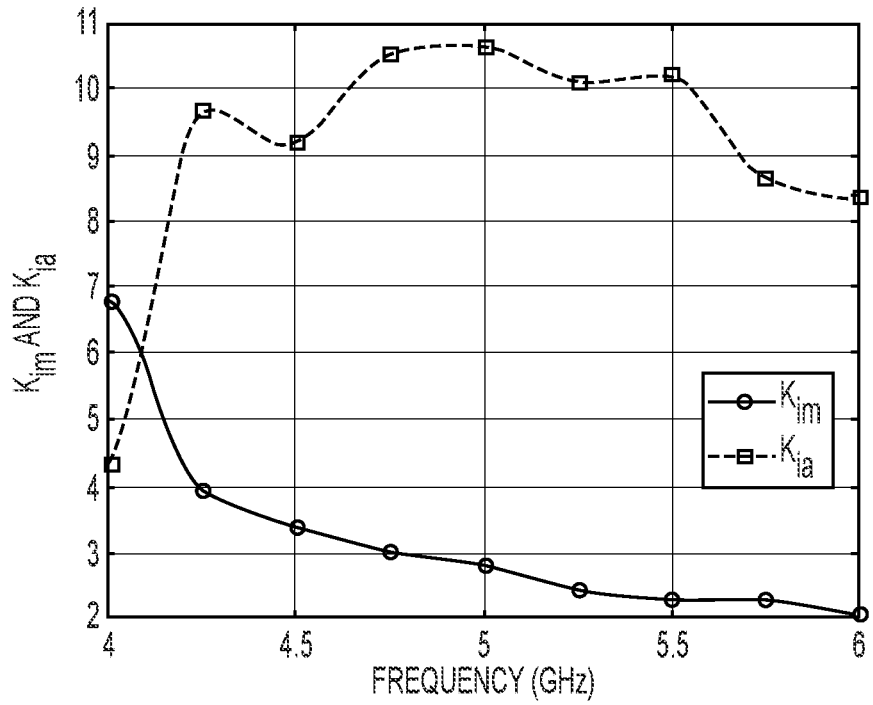
Figure 18D:
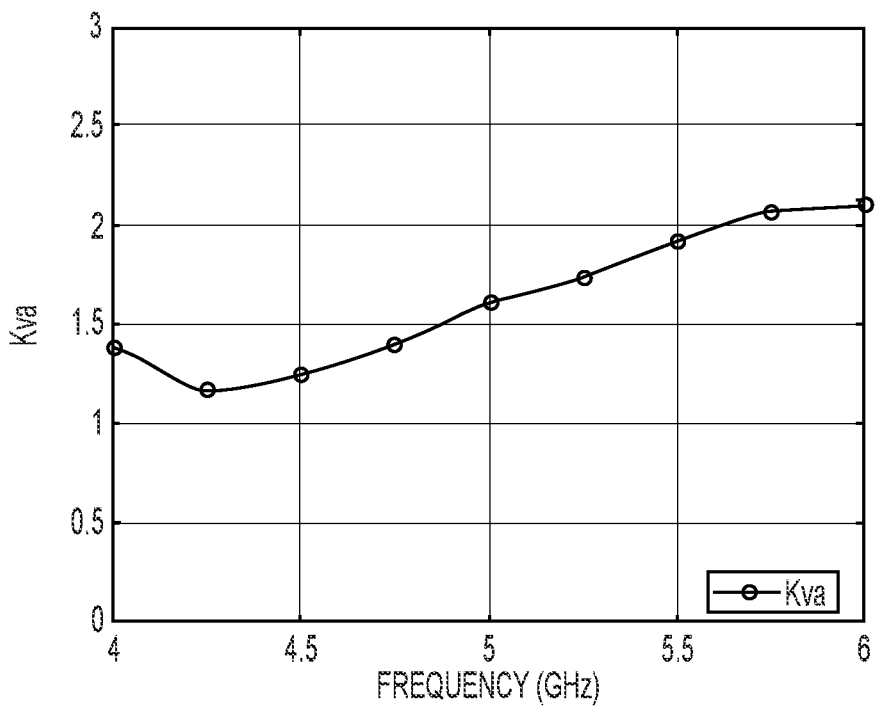

Shown in FIGS. 18A-18D are the theoretical and simulated K-factors as derived in the supporting documentation. FIG. 18A illustrates Theoretical $K_{im}$ and $K_{ia}$ values. FIG. 18B illustrates Theoretical $K_{va}$ values. FIG. 18C illustrates Simulated $K_{im}$ and $K_{ia}$ values. FIG. 18D illustrates Simulated $K_{va}$ values.

Figure 19:
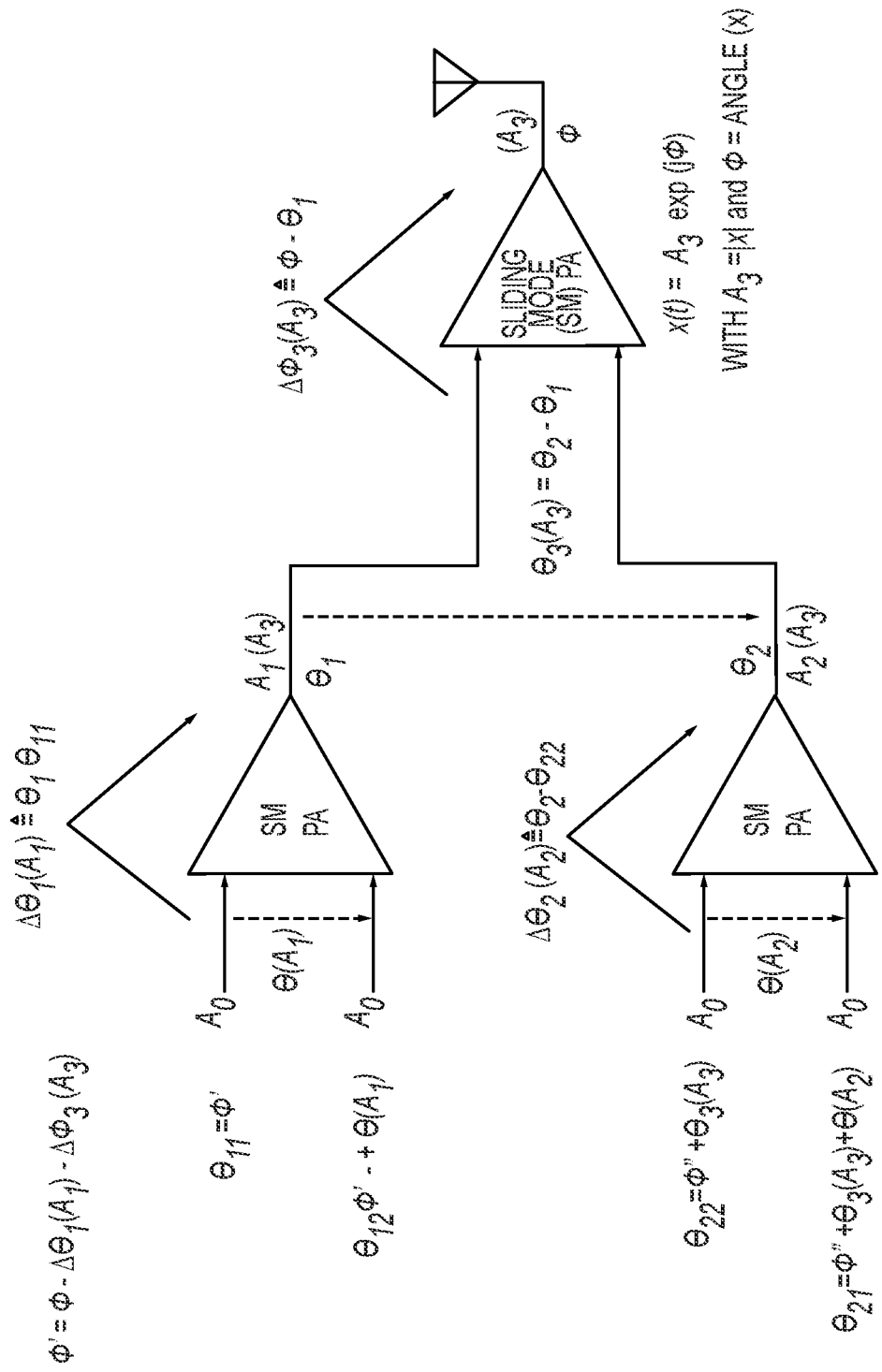
FIG. 19 illustrates an example Four Input Sliding Mode Diagram demonstrating a PA architecture that enables mixed-mode operating using three Sliding Mode PAs.

Mixed-Mode Sliding Mode Operation:

The original outphasing amplifiers were driven using a constant envelope signal. The variation in output power of the final stage PA was controlled through the outphasing angle between the two inputs of the dual-input PA. Further investigation into outphasing amplifiers revealed that a mode of operation that controlled the amplitude and phase of the signal driving the final stage PA achieved better performance when compared to the outphasing PA using a constant envelope signal. The use of a non-constant envelope signal and outphasing angle is typically called Mixed-Mode Operation and it facilitates higher efficiencies when compared to a constant-envelope driven PA. FIG. 19 illustrates Four Input Sliding Mode Diagram demonstrating a PA architecture that enables mixed-mode operating using three Sliding Mode PAs. Shown in FIG. 19 is an example diagram of how three Sliding Mode PAs can be used to enable Mixed-Mode Operation for the output stage of an RF transmitter while being driven by phase-modulated constant-envelope signals at the four inputs.

Extended Operating Band:

The above designed Sliding Mode PA has a high-performance frequency band which is the described 4-6 GHz frequency band. In addition to the high-performance frequency band, referred to as the normal operating band, the Sliding Mode PA can be operated in its extended operating frequency band. The extended operating frequency is 1-8 GHz. The motivation for designing a power amplifier to be operational in multiple frequency bands comes from a desire to have a single power amplifier be applicable for both commercial applications like telecommunications, in addition to defense applications such as Electronic Warfare (EW).

Figure 20A:
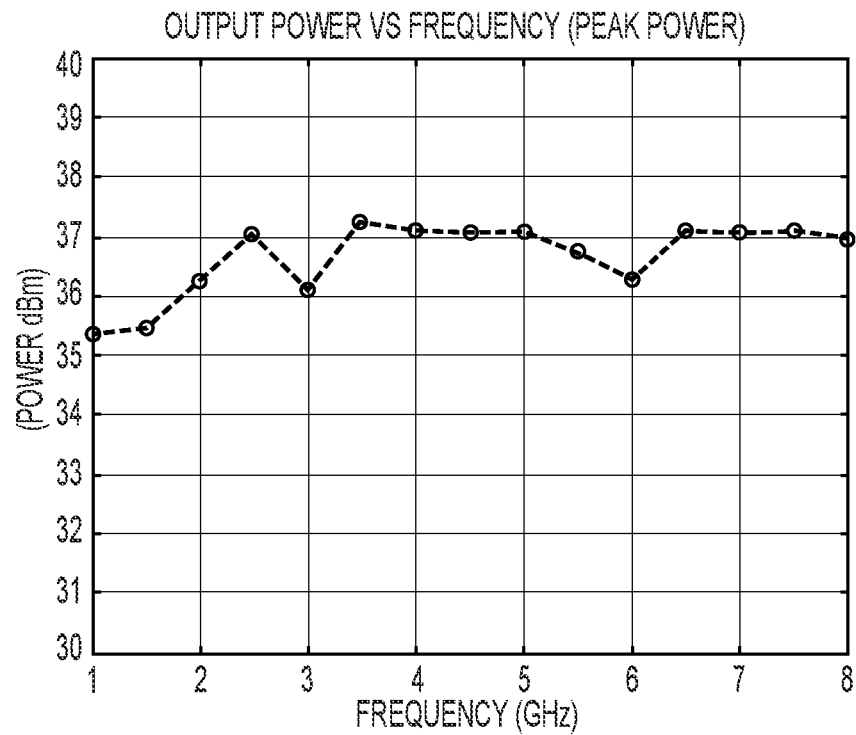
FIG. 20A illustrates Output power (dBm) vs Frequency (GHz) at peak output power measured at the CSRP.
Figure 20B:
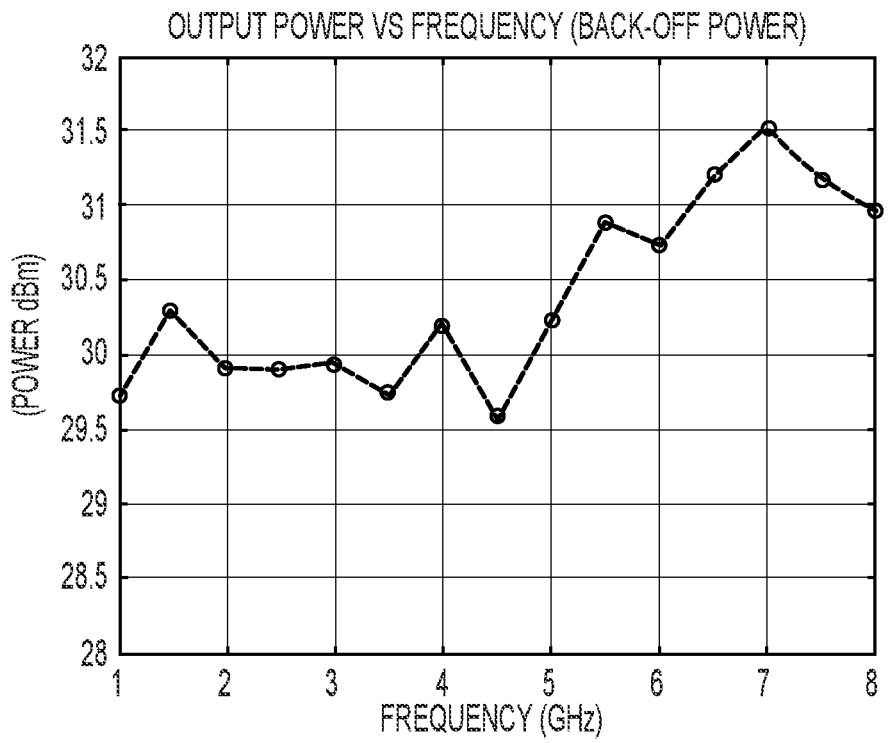
FIG. 20B illustrates Output power (dBm) vs Frequency (GHz) at back-off output power measured at the CSRP.

Shown in FIGS. 20A-20B are performance results for the Sliding Mode PA in the extended operating band. FIG. 20A illustrates Output power (dBm) vs Frequency (GHz) at peak output power measured at the CSRP. FIG. 20B illustrates Output power (dBm) vs Frequency (GHz) at back-off output power measured at the CSRP. Plotted is the output power at the targeted peak power, approximately 36 dBm, along with the targeted back-off output power, approximately 30 dBm plotted across the extended frequency range. In addition to the output power, the power added efficiency (PAE) is plotted across the extended frequency at peak and back-off output power.

Figure 21A:
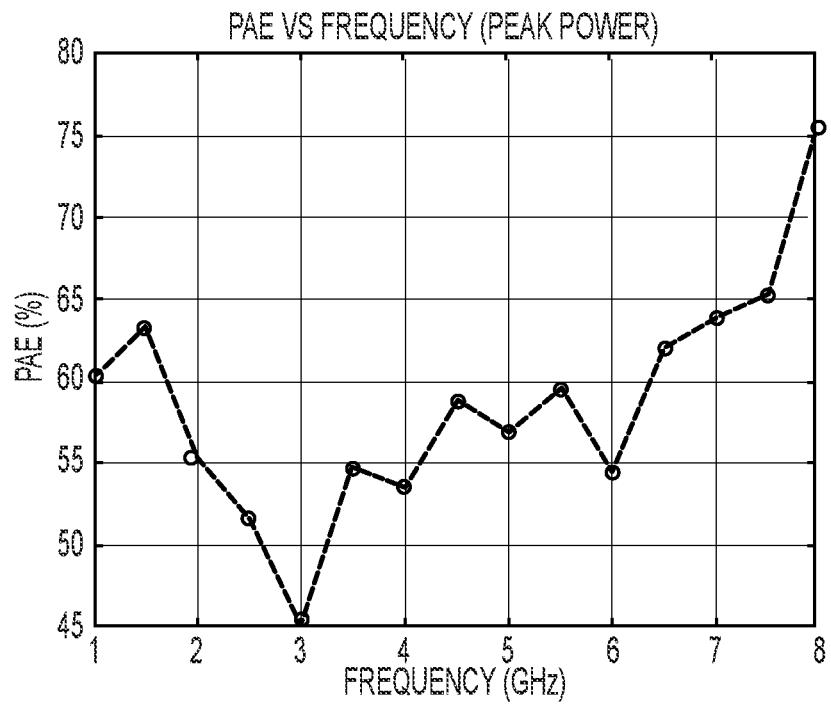
FIG. 21A illustrates PAE (%) vs Frequency (GHz) at peak output power measured at the CSRP.
Figure 21B:
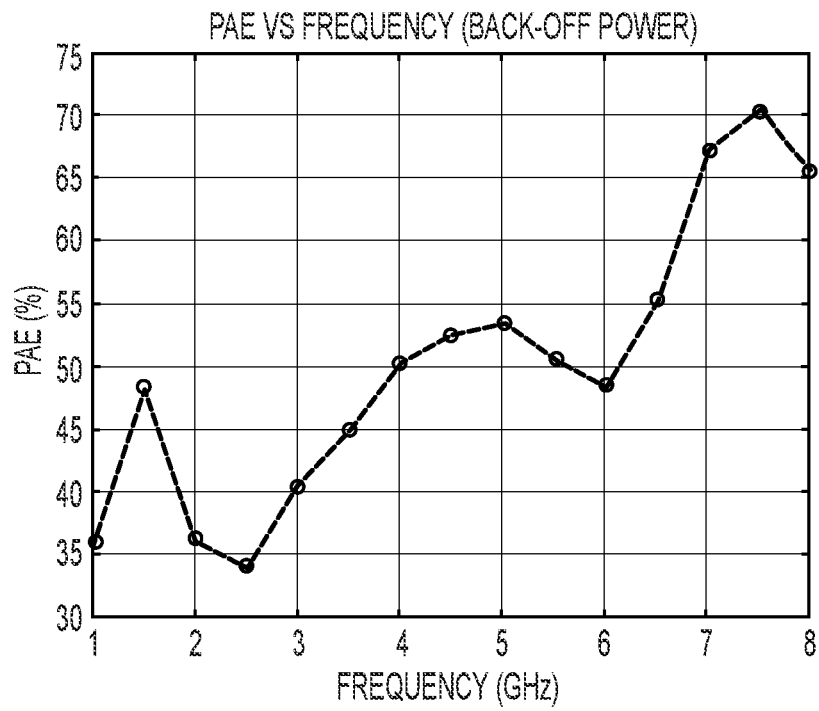
FIG. 21B illustrates PAE (%) vs Frequency (GHz) at back-off output power measured at the CSRP.

FIG. 21A illustrates PAE (%) vs Frequency (GHz) at peak output power measured at the CSRP. FIG. 21B illustrates PAE (%) vs Frequency (GHz) at back-off output power measured at the CSRP.

Numerous characteristics and advantages provided by aspects of the present disclosure have been set forth in the foregoing description and are set forth in the attached Appendices A and B together with details of structure and function. While the present disclosure is disclosed in several forms, it will be apparent to those skilled in the art that many modifications can be made therein without departing from the spirit and scope of the present disclosure and its equivalents. Therefore, other modifications or embodiments as may be suggested by the teachings herein are particularly reserved.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A dual transistor power amplifier (PA), comprising:
   a main branch transmission line ($TL_1$) having a main transistor and having a characteristic impedance $R_{opt}$;
   an auxiliary branch transmission line ($TL_2$) having an auxiliary transistor and having the characteristic impedance $R_{opt}$;
   a common load ($R_L$) to which the main branch transmission line and the auxiliary branch transmission line are connected,
   wherein the main branch transmission line ($TL_1$) and the auxiliary branch transmission line ($TL_2$) are matching networks established at a current-source reference plane (CSRP), and
   wherein the dual transistor PA provides a sliding mode on a Chireix-Doherty continuum by mapping an electrical length of the main branch transmission line $TL_1$ and an electrical length the auxiliary branch transmission line $TL_2$ across a targeted frequency band of operation with an outphasing angle.

2. The dual transistor power amplifier of claim 1, wherein the electrical length is determined with the following relationship:

$$\Theta_{1/2} = \Theta_{O_{\{1,2\}}} \frac{\omega}{\omega_O},$$

and
wherein $$\Theta_{O_1 = \frac{\pi}{2}},$$

$\Theta_{o_2 = \pi}$, $\omega = 2\pi f$, where f is a frequency of operation, wherein $\omega_o = 2\pi f_H$, where $f_H$ is a maximum frequency in a desired operating frequency range.

3. The dual transistor power amplifier of claim 2, wherein the dual transistor power amplifier operates in a Doherty mode of operation with 6 dB of output back-off (OBO) power at the maximum frequency when the outphasing angle between two inputs is equal to 90° which occurs when $\omega = \omega_o$.

4. The dual transistor power amplifier of claim 3, wherein, as the frequency of operation deviates from $\omega_o$, the mode operation gradually changes from the Doherty mode of operation to a Chireix mode of operation with 8 dB of OBO power at a minimum frequency.

5. The dual transistor power amplifier of claim 1, wherein the dual transistor power amplifier provides 40% fractional bandwidth while relying on a physical linear dispersion of transmission lines of a lossless output combiner.

6. The dual transistor power amplifier of claim 1, wherein the dual transistor power amplifier provides a constant output at peak power over an entire bandwidth.

7. The dual transistor power amplifier of claim 1, wherein the common load maintains a predetermined impedance for the main transistor and the auxiliary transistor while an output power of the dual transistor power amplifier varies from a peak output power to a back-off output (OBO) power.

8. The dual transistor power amplifier of claim 7, wherein the common load provides a DC drain biasing for the dual transistor power amplifier.

9. A method providing a sliding mode on a Chireix-Doherty continuum in a dual transistor power amplifier (PA) having a main branch transmission line ($TL_1$) having a main transistor and having a characteristic impedance $R_{opt}$, an auxiliary branch transmission line ($TL_2$) having an auxiliary transistor and having the characteristic impedance $R_{opt}$, and a common load ($R_L$) to which the mail branch transmission line and the auxiliary branch transmission line are connected, comprising:
  establishing, at a current-source reference plane (CSRP), the main branch transmission line ($TL_1$) and the auxiliary branch transmission line ($TL_2$) as matching networks; and
  mapping an electrical length of the main branch transmission $TL_1$ and an electrical length the auxiliary branch transmission $TL_2$ across a targeted frequency band of operation with an outphasing angle.

10. The method of claim 9, further comprising:
  determining the electrical length of transmission lines according to:

$$\Theta_{1/2} = \Theta_{O_{(1,2)}} \frac{\omega}{\omega_O},$$

and
wherein $$\Theta_{O_1 = \frac{\pi}{2}},$$

$\Theta_{O_2 = \pi}$, and $\omega = 2\pi f$, where f is a frequency of operation, $\omega_o = 2\pi f_H$, where $f_H$ is a maximum frequency in a desired operating frequency range.

11. The method of claim 10, further comprising operating the dual transistor power amplifier operates in a Doherty mode of operation with 6 dB of output back-off (OBO) power at a maximum frequency when the outphasing angle between two inputs is equal to 90° which occurs when $\omega = \omega_o$.

12. The method of claim 11, further comprising:
  varying a frequency of operation from $\omega_o$; and
  changing the mode operation from the Doherty mode of operation to a Chireix mode of operation with 8 dB of OBO power at the minimum frequency.

13. The method of claim 9, further comprising providing 40% fractional bandwidth while relying on a physical linear dispersion of transmission lines of a lossless output combiner.

14. The method of claim 9, further comprising providing a constant output at peak power over an entire bandwidth.

15. The method of claim 9, further comprising:
  maintaining a predetermined impedance at the common load for the main transistor and the auxiliary transistor as an output power of the dual transistor power amplifier varies from a peak output power to a back-off output (OBO) power.

16. The method of claim 15, further comprising providing, by the common load, a DC drain bias for dual transistor the power amplifier.

* * * * *